(12) United States Patent
Kuriyama et al.

(10) Patent No.: US 6,789,055 B1
(45) Date of Patent: Sep. 7, 2004

(54) TIMING VERIFICATION CHECKING VALUE EXTRACTING METHOD

(75) Inventors: Shigeru Kuriyama, Tokyo (JP); Masahiko Oomura, Tokyo (JP); Chie Hiramine, Tokyo (JP); Hiromi Fujita, Tokyo (JP); Masanori Kurimoto, Tokyo (JP); Takeshi Shibagaki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 759 days.

(21) Appl. No.: 09/706,829

(22) Filed: Nov. 7, 2000

(30) Foreign Application Priority Data

May 8, 2000 (JP) ........................................ 2000-135149

(51) Int. Cl.[7] .............................................. G06F 17/50
(52) U.S. Cl. .......................... 703/19; 703/13; 327/155
(58) Field of Search ..................... 703/13, 19; 327/141, 327/155, 91

(56) References Cited

U.S. PATENT DOCUMENTS

| | | | | |
|---|---|---|---|---|
| 4,590,595 A | * | 5/1986 | Morimura | .................... 370/307 |
| 5,798,730 A | * | 8/1998 | Sanchez | ...................... 342/195 |
| 6,232,899 B1 | * | 5/2001 | Craven | ........................ 341/126 |

FOREIGN PATENT DOCUMENTS

| | | | | |
|---|---|---|---|---|
| JP | 360187875 A | * | 9/1985 | ............. G01T/1/17 |
| JP | H10-116297 | | 5/1998 | |

\* cited by examiner

*Primary Examiner*—Albert W. Paladini
(74) *Attorney, Agent, or Firm*—Burns, Doane, Swecker & Mathis, L.L.P.

(57) ABSTRACT

The outputting of an output pulse produced in response to the inputting of a data pulse and a clock pulse to a D type flip-flop circuit is repeatedly simulated in a simulation process to extract a pulse time difference between the data pulse and the clock pulse as a timing verification checking value in a checking value extracting process on condition that the level of the output pulse becomes higher than a reference voltage until a simulation completion time and the pulse time difference is within a prescribed range. After the first simulation, an optimum simulation completion time, at which the levels of the data pulse, the clock pulse and the output pulse are respectively set to a constant high value, is determined to be place the optimum simulation completion time between a simulation start time and the simulation completion time, and the level of the output pulse is checked at the optimum simulation completion time in simulations following the first simulation. Therefore, a pulse time difference sufficiently made small can be rapidly and reliably extracted as a timing verification checking value.

8 Claims, 11 Drawing Sheets

| C \ D | 0.0 | 1.0 | 2.0 |
|---|---|---|---|
| 0.0 | 1.0 | 1.2 | 1.5 |
| 1.0 | | | |
| 2.0 | 1.3 | | |

TIMING VERIFICATION CHECKING VALUE EXTRACTING METHOD

BACKGROUND OF THE INVENTION

1. Field of the Invention

The present invention relates to a timing verification checking value extracting method used for the timing verification of pulses of a semiconductor integrated circuit.

2. Description of Related Art

In a design stage of a semiconductor integrated circuit, one or more input pulses are respectively input to a designed cell as a simulation, and it is checked whether or not one or more output pulses respectively reach an expected value within a prescribed time in response to the input pulses. Therefore, it is verified whether the input timing of the input pulses input to the designed cell is good or bad.

FIG. 17 is a flow chart showing a conventional timing verification checking value extracting method. As a prior art, a set up value is extracted as a timing verification checking value according to this conventional timing verification checking value extracting method of FIG. 17. For example, in case of the timing verification of pulses of a D type flip-flop circuit 11 shown in FIG. 3, the set up value denotes a time period required for the setting up of a data pulse 15 before the level change of a clock pulse 16 so as to prevent an erroneous operation of the D type flip-flop circuit 11.

As shown in FIG. 17, a waveform table and circuit connection information are prepared in advance (steps ST1 and ST2). In the waveform table, waveforms of both the data pulse 15 and the clock pulse 16 to be input to the D type flip-flop circuit 11, an initial setting value of a pulse 5 time difference 18 between the data pulse 15 and the clock pulse 16, an initial changing degree of the pulse time difference 18, a simulation completion time and a convergence condition of the pulse time difference 18 are written. Also, the circuit connection information indicates the arrangement of a plurality of transistors, resistors and capacitors composing the D type flip-flop circuit 11.

Thereafter, a group of steps 3, 4, 5 and 7 corresponding to one simulation stage is repeatedly performed. That is, a data pulse 15 and a clock pulse 16 to be input to the D type flip-flop circuit 11 are produced according to a setting value of the pulse time difference 18 and a changing degree of the pulse time difference 18 in a pulse producing process (step ST3). More precisely, in a first simulation stage of the step ST3, the data pulse 15 and the clock pulse 16 are produced so as to make the data pulse 15 earlier than the clock pulse 16 by the initial setting value written in the waveform table, and the changing degree of the pulse time difference 18 is set to the initial changing degree written in the waveform table.

Thereafter, in a simulation process (step ST4), the data pulse 15 is supplied to a data input terminal 12 of the D type flip-flop circuit 11, the clock pulse 16 is supplied to a clock input terminal 13 of the D type flip-flop circuit 11 at the pulse time difference 18 from the data pulse 15, a level of an output pulse 17 output from an output terminal 14 of the D type flip-flop circuit 11 is checked at the simulation completion time written in the waveform table, and it is judged whether the level of the output pulse 17 is good or bad.

The judgment of the level of the output pulse 17 is shown with the level changes of the pulses 15, 16 and 17 in FIG. 5. As shown in FIG. 5, a circuit simulation is started at a simulation start time 21, and it is judged whether the level of the output pulse 17 (an output pulse 17a or an output pulse 17b) becomes higher than a reference voltage 23 until the simulation completion time 22. In cases where the pulse time difference 18 is large, the level of the output pulse 17a corresponding to the large pulse time difference 18 becomes higher than the reference voltage 23 until the simulation completion time 22 in response to the inputting of a data pulse 15a corresponding to the large pulse time difference 18 and the clock pulse 16, and it is judged that the level of the output pulse 17a is good. This judgment is called an affirmative judgment in this specification. In contrast, in cases where the pulse time difference 18 is small, the level of the output pulse 17b corresponding to the small pulse time difference 18 does not become higher than the reference voltage 23 until the simulation completion time 22 in response to the inputting of a data pulse 15b corresponding to the small pulse time difference 18 and the clock pulse 16, and it is judged that the level of the output pulse 17b is not good. This judgment is called a negative judgment in this specification. Therefore, in cases where the pulse time difference 18 between the data pulse 15 and the clock pulse 16 is large, it is judged that the input timing of the data pulse 15 satisfies the set up value which denotes a time period required for the setting up of the data pulse 15 before the level change of the clock pulse 16 so as to prevent an erroneous operation of the D type flip-flop circuit 11 (the affirmative judgment). In contrast, in cases where the pulse time difference 18 is small, it is judged that the input timing of the data pulse 15 does not satisfy the set up value (the negative judgment). In the simulation process performed in the first simulation stage, as shown in FIG. 6, because the pulse time difference 18 is set to the initial setting value 26 (indicated by a simulation stage number (1) in FIG. 6) which is sufficiently high, the affirmative judgment is obtained.

After this simulation process (step ST4) is performed, it is judged in a convergence judging process (step ST5) whether or not a changing degree of the pulse time difference 18 is within a prescribed range. As shown in FIG. 6, because a changing degree of the pulse time difference 18 is set to the initial changing degree 27 in the first simulation stage, the changing degree of the pulse time difference 18 is not within the prescribed range. Therefore, the convergence condition is not satisfied. Thereafter, in cases where it is judged in the convergence judging process that the changing degree of the pulse time difference 18 is out of the prescribed range, a pulse time difference resetting process (step ST7) is performed. In this process, a setting value of the pulse time difference 18 set in the pulse producing process (step ST3) is changed according to the judgment performed in the simulation process (step ST4), and a changing degree of the pulse time difference set in the pulse producing process (step ST3) is reduced in cases where the affirmative (or negative) judgment of the simulation process obtained in a preceding simulation stage changes to the negative (or affirmative) judgment in a current simulation stage.

More precisely, as shown in FIG. 6, in cases where the affirmative judgment of the simulation process is obtained in both the preceding and current simulation stages, the setting value of the pulse time difference 18 is decreased by the changing degree of the pulse time difference 18, and the changing degree of the pulse time difference 18 is maintained. Also, in cases where the affirmative judgment of the simulation process obtained in the preceding simulation stage changes to the negative judgment in the current simulation stage, because a set up truth value 29 to be idealistically extracted exists between a pulse time difference in the preceding simulation stage and a pulse time difference in the current simulation stage, the changing degree of the pulse time difference 18 is halved, and the setting value of the pulse time difference 18 is increased by the halved changing degree. Also, in cases where the negative judgment of the simulation process obtained in the preceding simulation stage changes to the affirmative judgment in the current simulation stage, because the set up truth value 29 exists between pulse time differences of the preceding and current simulation stages, the changing degree of the pulse time difference 18 is halved, and the setting value of the pulse time difference 18 is decreased by the halved changing degree. Also, when the affirmative judgment of the simulation process is obtained in the first simulation stage, the initial setting value of the pulse time difference 18 is decreased by theinitial changing degree of the pulse time difference 18.

Thereafter, the pulse producing process (step ST3) is again performed. In this process, a data pulse 15 and a clock pulse 16 are again produced so as to satisfy the setting value of the pulse time difference 18 and the changing degree of the pulse time difference 18 reset in the pulse time difference resetting process (step ST7). Thereafter, the simulation process (step ST4) and the convergence judging process (step ST5) are performed in the same manner as that in the preceding simulation stage. In cases where the convergence condition is not satisfied in the convergence judging process, the pulse time difference resetting process (step ST7), the pulse producing process (step ST3), the simulation process (step ST4) and the convergence judging process (step ST5) are again performed.

Therefore, because the setting value of the pulse time difference 18 and the changing degree of the pulse time difference 18 are repeatedly reset in the pulse time difference resetting process to make the setting value of the pulse time difference 18 approach the set up truth value 29, it is finally judged in the convergence judging process (step ST5) that a changing degree of the pulse time difference 18 is within the prescribed range, and the convergence condition is satisfied.

Thereafter, in a checking value extracting process (step ST8), in cases where the affirmative judgment is obtained in the simulation process of the final simulation stage, because the setting value of the pulse time difference 18 finally reset in the pulse time difference resetting process (step ST7) can be adopted as the set up value, the setting value of the pulse time difference 18 finally reset is extracted as a timing verification checking value. Also, in cases where the negative judgment is obtained in the simulation process of the final simulation stage, because the setting value of the pulse time difference 18 finally reset in the pulse time difference resetting process (step ST7) cannot be adopted as the set up value, the setting value of the pulse time difference 18 reset in the pulse time difference resetting process (step ST7) in a specific simulation stage (usually just before the final simulation stage), in which the affirmative judgment is finally obtained in the simulation process, is extracted as a timing verification checking value. Therefore, the timing verification checking value can be extracted.

However, because the conventional timing verification checking value extracting method is performed according to the processing of FIG. 17, in cases where the conventional timing verification checking value extracting method is performed for various circuits, the simulation completion time 22 depending on each circuit is not properly set. That is, in cases where the simulation completion time 22 is set to be sufficiently later than the simulation start time 21, a simulation time period required for each simulation process is lengthened. Therefore, there is a problem that it takes a lot of time to extract a timing verification checking value. In contrast, in cases where the simulation completion time 22 is set to be insufficiently later than the simulation start time 21, the negative judgment is obtained in the first simulation stage. Therefore, there is a problem that the conventional timing verification checking value extracting method cannot be performed.

SUMMARY OF THE INVENTION

An object of the present invention is to provide, with due consideration to the drawbacks of the conventional timing verification checking value extracting method, a timing verification checking value extracting method in which a timing verification checking value is reliably extracted without taking a lot of time.

The object is achieved by the provision of a timing verification checking value extracting method, comprising:

a pulse producing step for producing two input pulses having a pulse time difference of which a setting value is set to an initial setting value in advance;

a simulation step for supplying each of the input pulses produced in the pulse producing step to an input terminal of a to-be-timing-verified circuit and judging, until a simulation completion time set in advance, whether or not an output pulse output from an output terminal of the to-be-timing-verified circuit is good;

an optimum simulation completion time determining step for determining an optimum simulation completion time, which is to be used in the simulation step as the simulation completion time in simulation stages following a first simulation stage, according to a level change time at which the output pulse is changed to a stable level in the first simulation stage;

a pulse time difference resetting step for resetting the setting value of the pulse time difference between the input pulses, which is to be produced in the pulse producing step in a succeeding simulation stage following a current simulation stage, according to the judgment of the simulation step of the current simulation stage by changing the setting value of the pulse time difference by a changing degree, and reducing the changing degree of the pulse time difference in cases where the judgment of the simulation step in the current stage differs from that in a simulation stage preceding to the current stage;

a convergence judging step for judging whether or not the changing degree of the pulse time difference reset in the pulse time difference resetting step is within a prescribed range and making the pulse producing step, the simulation step, the optimum simulation completion time determining step and the pulse time difference resetting step be repeatedly performed until the changing degree of the pulse time difference becomes within the prescribed range; and a checking value extracting step for extracting the pulse time difference between the input pulses as a timing verification checking value according to the judgment performed in the convergence judging step.

In the above steps, though the judgment whether or not the output pulse is good is performed until the simulation completion time set in advance in the simulation step of the first simulation stage, the judgment is performed until an optimum simulation completion time, which is determined in the optimum simulation completion time determining step, in the simulation step of each simulation stage following the first simulation stage. Therefore, a simulation time required in the simulation step, in which the judgment is performed until the optimum simulation completion time, is shortened as compared with that required in the simulation step in which the judgment is performed until the simulation completion time set in advance.

Accordingly, the timing verification checking value can be reliably extracted at high speed.

The object is also achieved by the provision of a timing verification checking value extracting method, comprising:

a pulse producing step for producing two input pulses having a pulse time difference, of which a setting value is set to an initial setting value in advance, and respectively having a pulse inclination;

a simulation step for supplying each of the input pulses produced in the pulse producing step to an input terminal of a to-be-timing-verified circuit and judging whether or not an output pulse output from an output terminal of the to-be-timing-verified circuit is good;

a pulse time difference resetting step for resetting the setting value of the pulse time difference between the input pulses, which is to be produced in the pulse producing step in a succeeding simulation stage following a current simulation stage, according to the judgment of the simulation step of the current simulation stage by changing the setting value of the pulse time difference by a changing degree, and reducing the changing degree of the pulse time difference in cases where the judgment of the simulation step in the current stage differs from that in a simulation stage preceding to the current stage;

a convergence judging step for judging whether or not the changing degree of the pulse time difference reset in the pulse time difference resetting step is within a prescribed range and making the pulse producing step, the simulation step and the pulse time difference resetting step be repeatedly performed until the changing degree of the pulse time difference becomes within the prescribed range;

a checking value extracting step for extracting the pulse time difference between the input pulses respectively having the pulse inclination as a timing verification checking value according to the judgment performed in the convergence judging step;

a pulse inclination resetting step for setting the pulse inclinations of the input pulses, which are produced in the pulse producing step, to a set of first pulse inclinations to extract the pulse time difference between the input pulses having the first pulse inclinations as a timing verification checking value in the checking value extracting step, resetting the pulse inclinations of the input pulses, which are produced in the pulse producing step, to a set of second pulse inclinations to extract the pulse time difference between the input pulses having the second pulse inclinations as a timing verification checking value in the checking value extracting step, and resetting the pulse inclinations of the input pulses, which are produced in the pulse producing step, to a set of third pulse inclinations between the set of first pulse inclinations and the set of second pulse inclinations to extract the pulse time difference between the input pulses having the third pulse inclinations as a timing verification checking value in the checking value extracting step; and an initial pulse time difference setting step for setting the pulse time difference for the input pulses, which are produced in the pulse producing step and have the third pulse inclinations reset in the pulse inclination resetting step, to a particular setting value according to the timing verification checking value, which is extracted in the checking value extracting step and corresponds to the input pulses having the first pulse inclinations, and the timing verification checking value, which is extracted in the checking value extracting step and corresponds to the input pulses having the second pulse inclinations, to produce the input pulses having the pulse time difference set to the particular setting value and having the third pulse inclinations in the pulse producing step.

In the above steps, after the pulse time difference between the input pulses having the first pulse inclinations and the pulse time difference between the input pulses having the second pulse inclinations are extracted in the checking value extracting step, the pulse inclinations of the input pulses are reset in the pulse inclination resetting step to a set of third pulse inclinations between the set of first pulse inclinations and the set of second pulse inclinations, and the initial setting value of the pulse time difference for the input pulses having the third pulse inclinations is set to the particular setting value in the initial pulse time difference setting step according to the timing verification checking value of the input pulses having the first pulse inclinations and the timing verification checking value of the input pulses having the second pulse inclinations. For example, the pulse time difference for the input pulses having the third pulse inclinations is set to an average value between the timing verification checking values. Thereafter, the input pulses having the pulse time difference set to the particular setting value and having the third pulse inclinations are produced in the pulse producing step.

Accordingly, because the pulse time difference for the input pulses having the third pulse inclinations is not set to the initial setting value but is set to the particular setting value near to a timing verification checking value to be idealistically extracted, the timing verification checking value for the input pulses having the third pulse inclinations can be reliably extracted at high speed.

It is preferred that the timing verification checking value extracting method further comprises a pulse time difference initial changing degree setting step for setting the changing degree of the pulse time difference to a particular changing degree according to the particular setting value of the pulse time difference set in the initial pulse time difference setting step and either the timing verification checking value, which is extracted in the checking value extracting step and corresponds to the input pulses having the first pulse inclinations, or the timing verification checking value, which is extracted in the checking value extracting step and corresponds to the input pulses having the second pulse inclinations, to reset the setting value of the pulse time difference for the input pulses having the third pulse inclinations according to the particular changing degree of the pulse time difference in the pulse time difference resetting step.

In the above step, the changing degree of the pulse time difference for the input pulses having the third pulse inclinations is set to a particular changing degree in the pulse time difference initial changing degree setting step, and the setting value of the pulse time difference for the input pulses having the third pulse inclinations is reset in the pulse time difference resetting step by changing the setting value of the pulse time difference by the particular changing degree.

Accordingly, because the setting value of the pulse time difference for the input pulses having the third pulse inclinations is not changed by a changing degree set in advance but is changed by the particular changing degree, an extraction time required to extract the timing verification checking value corresponding to the input pulses having the third pulse inclinations in the checking value extracting step can be shortened.

It is also achieved by the provision of a timing verification checking value extracting method, comprising:

a pulse producing step for producing two input pulses having a pulse time difference of which a setting value is set to an initial setting value in advance;

a simulation step for supplying each of the input pulses produced in the pulse producing step to an input terminal of a to-be-timing-verified circuit and judging whether or not an output pulse output from an output terminal of the to-be-timing-verified circuit is good;

a pulse time difference resetting step for repeatedly performing the resetting of the setting value of the pulse time difference between the input pulses, which is to be produced in the pulse producing step in a succeeding simulation stage following a current simulation stage, according to the judgment of the simulation step of the current simulation stage by changing the setting value of the pulse time difference by a changing degree until the judgment of the simulation step of the current simulation stage differs from that of a simulation stage preceding to the current simulation stage to place the pulse time difference in the neighborhood of a set up truth value, repeatedly performing the resetting of the setting value of the pulse time difference between the input pulses, which is to be produced in the pulse producing step in the succeeding simulation stage, according to the judgment of the simulation step of the current simulation stage by changing the setting value of the pulse time difference by the changing degree until the judgment of the simulation step of the current simulation stage again differs from that of a simulation stage preceding to the current simulation stage to place the pulse time difference in the neighborhood of a hold truth value, repeatedly performing the resetting of the setting value of the pulse time difference placed in the neighborhood of the set up truth value while reducing the changing degree of the pulse time difference according to the judgment of the simulation step of the current simulation stage and repeatedly performing the resetting of the setting value of the pulse time difference placed in the neighborhood of the hold truth value while reducing the changing degree of the pulse time difference according to the judgment of the simulation step of the current simulation stage;

a convergence judging step for judging whether or not the changing degree of the pulse time difference reset in the pulse time difference resetting step is within a prescribed range, making the pulse producing step, the simulation step and the pulse time difference resetting step be repeatedly performed until the changing degree of the pulse time difference placed in the neighborhood of the set up truth value becomes within the prescribed range and again making the pulse producing step, the simulation step and the pulse time difference resetting step be repeatedly performed until the changing degree of the pulse time difference placed in the neighborhood of the hold truth value becomes within the prescribed range; and a checking value extracting step for extracting the pulse time difference between the input pulses as a timing verification checking value denoting a set up value, in cases where it is judged in the convergence judging step that the changing degree of the pulse time difference placed in the neighborhood of the set up truth value is within the prescribed range, and extracting the pulse time difference between the input pulses as a timing verification checking value denoting a hold value in cases where it is judged in the convergence judging step that the changing degree of the pulse time difference placed in the neighborhood of the hold truth value is within the prescribed range.

In the above steps, the pulse time difference is changed by the changing degree every simulation stage in the pulse time difference resetting step until the judgment of the simulation step of the current simulation stage differs from that of a simulation stage preceding to the current simulation stage, so that the pulse time difference is placed in the neighborhood of a set up truth value to be idealistically extracted as a timing verification checking value. Thereafter, the pulse time difference is again changed by the changing degree every simulation stage in the pulse time difference resetting step until the judgment of the simulation step of the current simulation stage differs from that of the preceding simulation stage, so that the pulse time difference is placed in the neighborhood of a hold truth value to be idealistically extracted as a timing verification checking value.

Thereafter, the pulse time difference placed in the neighborhood of the set up truth value is changed by the changing degree every simulation stage in the pulse time difference resetting step while reducing the changing degree of the pulse time difference according to the judgment of the simulation step of the current simulation stage. In cases where it is judged in the convergence judging step that the changing degree of the pulse time difference is within the prescribed range, the pulse time difference between the input pulses is extracted as a timing verification checking value denoting a set up value in the checking value extracting step.

Thereafter, the pulse time difference placed in the neighborhood of the hold truth value is changed by the changing degree every simulation stage in the pulse time difference resetting step while reducing the changing degree of the pulse time difference according to the judgment of the simulation step of the current simulation stage. In cases where it is judged in the convergence judging step that the changing degree of the pulse time difference is within the prescribed range, the pulse time difference between the input pulses is extracted as a timing verification checking value denoting a hold value in the checking value extracting step.

Accordingly, because the simulation, which is repeatedly performed in the simulation step for the input pulses having the pulse time difference to place the pulse time difference in the neighborhood of the set up truth value, is common to both the extraction of the timing verification checking value denoting a set up value and the extraction of the timing verification checking value denoting a hold value, the timing verification checking values can be rapidly extracted.

It is applicable that the simulation step comprising the steps of:

detecting a delay time which extends from the supply of the one input pulse to the to-be-timing-verified circuit to the production of the output pulse and changes with the pulse time difference; and judging that the output pulse is not good in cases where the delay time is longer than a prescribed limit.

In the above steps, in cases where the delay time is longer than a prescribed limit, there is a possibility that the to-be-timing-verified circuit such as a D type flip-flop circuit is erroneously operated. Therefore, in cases where the delay time is longer than a prescribed limit, it is judged that the output pulse is not good.

Accordingly, the timing verification checking value can be reliably extracted with high precision without erroneously operating the to-be-timing-verified circuit.

It is applicable that the simulation step comprising the steps of:
- detecting a pulse inclination of one input pulse changing with the pulse time difference; and
- judging that the output pulse is not good in cases where the pulse inclination exceeds a prescribed limit.

In the above steps, in cases where the pulse inclination exceeds a prescribed limit, there is a possibility that the to-be-timing-verified circuit such as a D type flip-flop circuit is erroneously operated. Therefore, in cases where the pulse inclination exceeds a prescribed limit, it is judged that the output pulse is not good.

Accordingly, the timing verification checking value can be reliably extracted with high precision without erroneously operating the to-be-timing-verified circuit.

It is preferred that one of the input pulses produced in the pulse producing step has a pulse width of which a setting value is set to an initial setting value in advance, the setting value of the pulse width of the input pulse is reset in the pulse time difference resetting step according to the judgment of the simulation step of the current simulation stage by changing the setting value of the pulse width by a changing degree, the changing degree of the pulse width is reduced in the pulse time difference resetting step in cases where the judgment of the simulation step in the current stage differs from that in a simulation stage preceding to the current stage, it is judged in the convergence judging step whether or not the changing degree of the pulse width reset in the pulse time difference resetting step is within a prescribed range, and the pulse width is extracted in the checking value extracting step as a timing verification checking value in cases where it is judged in the convergence judging step that the pulse width is within the prescribed range.

In the above steps, the pulse width of one input pulse is extracted in place of the pulse time difference between the input pulses as a timing verification checking value.

Accordingly, the pulse width can be reliably extracted as a timing verification checking value.

It is preferred that the checking value extracting step comprises the steps of:
- extracting the pulse time difference finally reset in the pulse time difference resetting step as a timing verification checking value in cases where it is judged in the simulation step of the final simulation stage that the output pulse is good; and
- extracting the pulse time difference corresponding to a specific simulation stage, in which it is finally judged that the output pulse is good, in cases where it is judged in the simulation step of the final simulation stage that the output pulse is not good.

In the above steps, because the pulse time difference extracted as a timing verification checking value always corresponds to the final judgment that the output pulse is good, the timing verification checking value can be reliably extracted.

DETAILED DESCRIPTION OF THE PREFERRED EMBODIMENTS

The invention will now be described with reference to the accompanying drawings.

Embodiment 1

Figure 1:
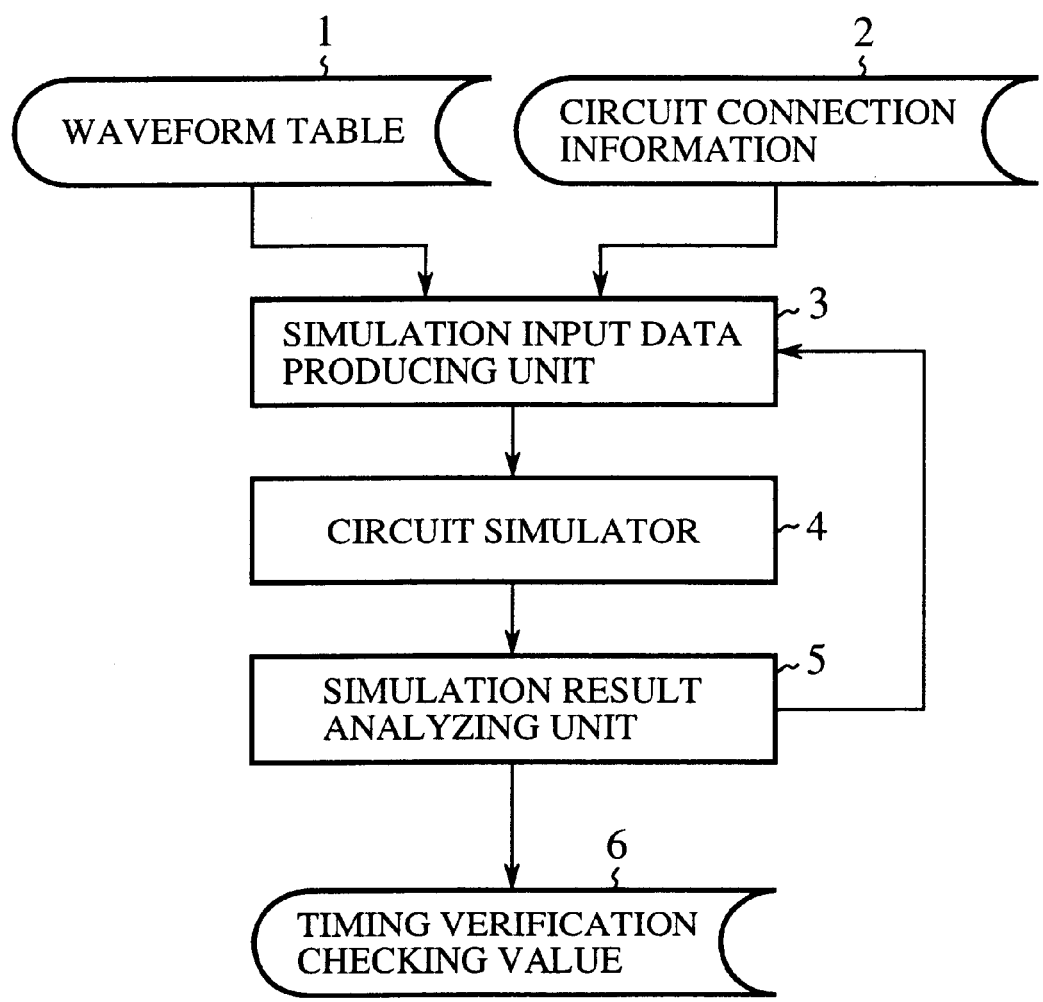
FIG. 1 is a functional block diagram of a timing verification checking value extracting apparatus according to a first embodiment of the present invention.

FIG. 1 is a functional block diagram of a timing verification checking value extracting apparatus according to a first embodiment of the present invention. In FIG. 1, a reference numeral 1 indicates a waveform table. In the waveform table 1, pulse conditions such as waveforms of input pulses to be supplied to a circuit for which the timing of the input pulses is verified (called a to-be-timing-verified circuit), an initial setting value of a pulse time difference between the input pulses, an initial changing degree of the pulse time difference, a simulation completion time and a convergence condition of the pulse time difference are written. A reference numeral 2 indicates circuit connection information of the to-be-timing-verified circuit. In cases where the to-be-timing-verified circuit is a D type flip-flop circuit, the circuit connection information 2 indicates the arrangement of a plurality of transistors, resistors and capacitors composing the D type flip-flop circuit.

A reference numeral 3 indicates a simulation input data producing unit in which the input pulses are produced so as to satisfy the pulse conditions written in the waveform table 1 and the circuit connection information 2. A reference numeral 4 indicates a circuit simulator in which simulation is performed by supplying the input pulses produced in the simulation input data producing unit 3 to the to-be-timing-verified circuit. In the circuit simulator 4, a level of an output pulse is output as a simulation result. A reference numeral 5 indicates a simulation result analyzing unit in which the simulation result obtained in the circuit simulator 4 is analyzed to judge whether or not a setting value of the pulse time difference is appropriate as a set up value. In the simulation result analyzing unit 5, the pulse time difference is gradually decreased while performing the affirmative judgment and the negative judgment. Also, the simulation result analyzing unit 5 controls the simulation input data producing unit 3 and the circuit simulator 4 to be operated each time the pulse time difference is changed, and it is judged whether or not the pulse time difference satisfies the convergence condition. In cases where the pulse time difference satisfies the convergence condition, a timing verification checking value 6 is output from the simulation result analyzing unit 5. The units and simulator 3, 4 and 5 are formed of a computer system.

Figure 2:
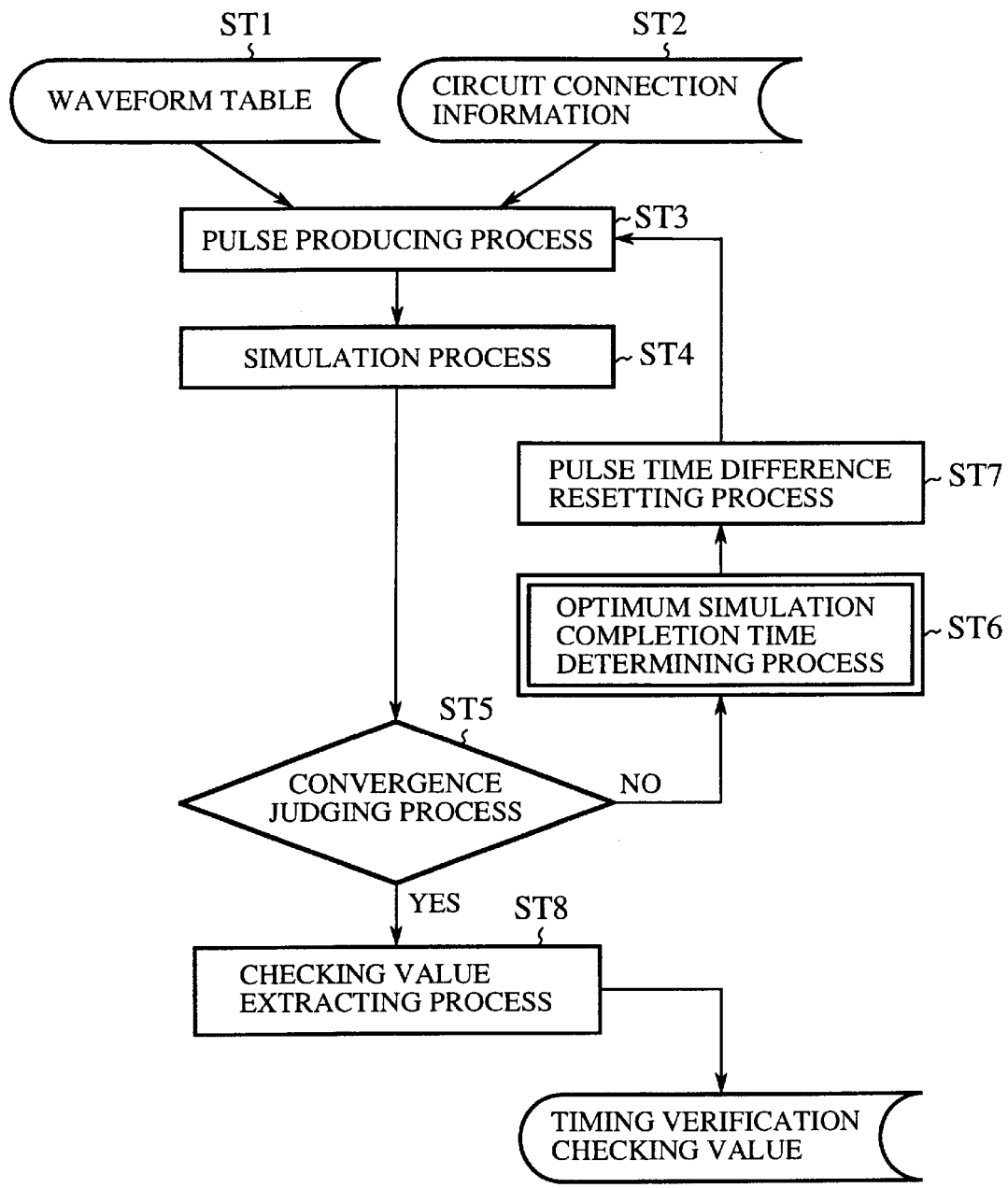
FIG. 2 is a flow chart showing a timing verification checking value extracting method, which is performed in the timing verification checking value extracting apparatus shown in FIG. 1, according to the first embodiment of the present invention.

FIG. 2 is a flow chart showing a timing verification checking value extracting method performed in the timing verification checking value extracting apparatus according to the first embodiment of the present invention. In FIG. 2, after the pulse producing process (step ST3), the simulation process (step ST4) and the convergence judging process (step ST5) are performed in a first simulation stage, an optimum simulation completion time determining process (step ST6) is performed to change the simulation completion time written in the waveform table 1 to an optimum simulation completion time, and the simulation process (step ST4) is performed according to the optimum simulation completion time in succeeding simulation stages.

Figure 3:
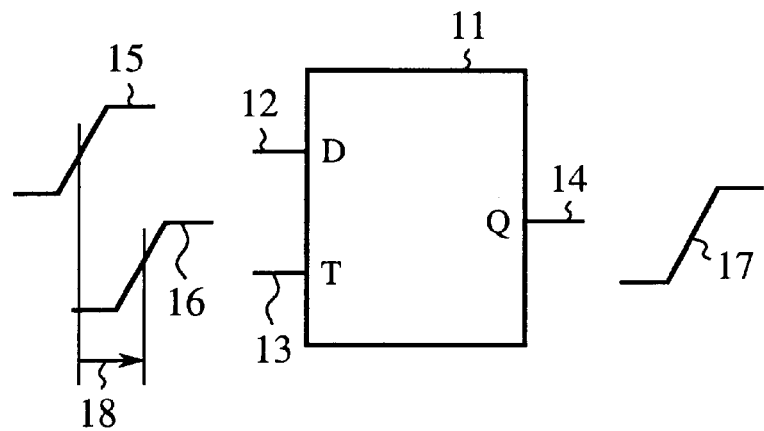
FIG. 3 is an explanatory view showing a pulse time difference of input pulses supplied to a to-be-timing-verified circuit and an output pulse output from the to-be-timing-verified circuit.

FIG. 3 is an explanatory view showing a pulse time difference of input pulses supplied to a to-be-timing-verified circuit and an output pulse output from the to-be-timing-verified circuit. In FIG. 3, a reference numeral 11 indicates a D type flip-flop circuit (or a to-be-timing-verified circuit), a reference numeral 12 indicates-a data input terminal (or an input terminal) of the D type flip-flop circuit 11, a reference numeral 13 indicates a clock input terminal (or another input terminal) of the D type flip-flop circuit 11, and a reference numeral 14 indicates an output terminal of the D type flip-flop circuit 11. Also, a reference numeral 15 indicates a data pulse supplied to the data input terminal 12, a reference numeral 16 indicates a clock pulse supplied to the clock input terminal 13, a reference numeral 17 indicates an output pulse output from the output terminal 14, and a reference numeral 18 indicates a pulse time difference between a rise time of the data pulse 15 and a rise time of the clock pulse 16.

A timing verification checking value extracting method performed in the timing verification checking value extracting apparatus shown in FIG. 1 is described.

In a design stage of a semiconductor integrated circuit, one or more input pulses are respectively input to a designed cell as a simulation, and it is checked whether or not one or more output pulses respectively reach an expected value in a prescribed time in response to the input pulses. In the timing verification checking value extracting apparatus shown in FIG. 1, each of a set up value, a hold value and a minimum pulse width is extracted as a timing verification checking value. Also, a timing verification checking value is extracted when a changing degree of a level of each input pulse (or an inclination of each input pulse) is changed. Here, in cases where the to-be-timing-verified circuit is a D type flip-flop circuit 11 shown in FIG. 3, the set up value denotes a time period which starts from the level change of the data pulse 15 and in which the level change of the clock pulse 16 is forbidden so as to prevent an erroneous operation of the D type flip-flop circuit 11. This definition of the set up value is substantially the same as that in the conventional timing verification checking value extracting method. The hold value denotes a time period which starts from the level change of the clock pulse 16 and in which the level change of the data pulse 15 is forbidden so as to prevent an erroneous operation of the D type flip-flop circuit 11. The minimum pulse width denotes a minimum pulse width 20 of the clock pulse 19 (refer to FIG. 4) on condition that the D type flip-flop circuit 11 is operated without any erroneous operation.

A method for extracting the pulse time difference 18 as a timing verification checking value denoting a set up value while maintaining an inclination of a leading edge of each input pulse (the data pulse 15 and the clock pulse 16) is initially described with reference to FIG. 1 and FIG. 2.

The waveform table 1 and the circuit connection information 2 are prepared in advance (steps ST1 and ST2). In the waveform table 1, waveforms of the data pulse 15 and the clock pulse 16 to be supplied to the D type flip-flop circuit 11, an initial setting value of the pulse time difference 18 between the data pulse 15 and the clock pulse 16, an initial changing degree of the pulse time difference 18, a simulation completion time 22 and a convergence condition 23 of the pulse time difference are written. In the circuit connection information 2, the arrangement of a plurality of transistors, resistors and capacitors composing the D type flip-flop circuit 11.

Thereafter, in the simulation input data producing unit 3, the data pulse 15 and the clock pulse 16 to be supplied to the D type flip-flop circuit 11 are produced according to the waveform table 1 and the circuit connection information 2 in the pulse producing process (step ST3).

Thereafter, in the circuit simulator 4, the data pulse 15 is supplied to the data input terminal 12 of the D type flip-flop circuit 11, the clock pulse 16 is supplied to the clock input terminal 13 of the D type flip-flop circuit 11, the simulation for producing the output pulse 17 from the data pulse 15 and the clock pulse 16 is started at the simulation start time 21, and a level of the output pulse 17 output from the output terminal 14 of the D type flip-flop circuit 11 is checked at the simulation completion time 22 in the first simulation stage of the simulation process (step ST4).

Thereafter, in the simulation result analyzing unit 5, it is judged whether or not the level of the output pulse 17 is higher than the reference voltage 23 (step ST4).

Figure 5:
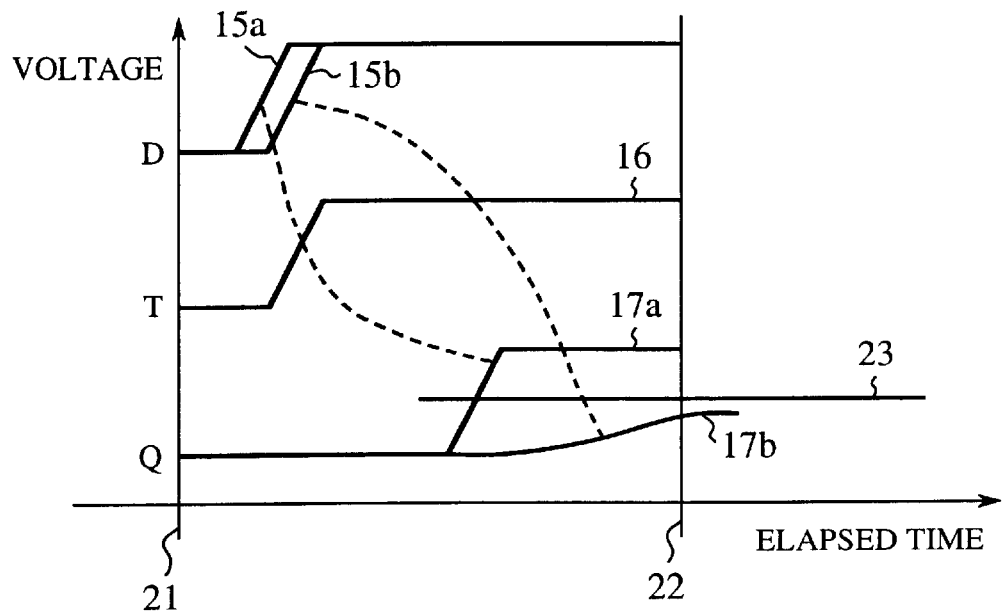
FIG. 5 is an explanatory view of a pulse-time relationship used for an affirmative judgment and a negative judgment which are performed in a simulation result analyzing unit of the timing verification checking value extracting apparatus shown in FIG. 1.

FIG. 5 is an explanatory view of a pulse-time relationship used for an affirmative judgment and a negative judgment which are performed in the simulation result analyzing unit 4. In FIG. 5, a reference numeral 15a indicates a data pulse in case of a large pulse time difference 18, a reference numeral 15b indicates a data pulse in case of a small pulse time difference 18, a reference numeral 17a indicates an output pulse obtained in response to the data pulse 15a, a reference numeral 17b indicates an output pulse obtained in response to the data pulse 15b, a reference numeral 21 indicates a simulation start time, a reference numeral 22 indicates a simulation completion time, and a reference numeral 23 indicates a reference voltage determined in advance.

For example, the level of the output pulse 17a obtained in response to the data pulse 15a becomes higher than the reference voltage 23 at the simulation completion time 22 in case of the large pulse time difference 18, and the affirmative judgment is performed. In contrast, the level of the output pulse 17b obtained in response to the data pulse 15b is lower than the reference voltage 23 at the simulation completion time 22 in case of the small pulse time difference 18, and the negative judgment is performed. Therefore, in cases where the pulse time difference 18 between the data pulse 15 and the clock pulse 16 is large, it is judged that the input timing of the data pulse 15 satisfies the set up value which denotes a time period which starts from the level change of the data pulse 15 and in which the level change of the clock pulse 16 is forbidden so as to prevent an erroneous operation of the D type flip-flop circuit 11. In contrast, in cases where the pulse time difference 18 is small, it is judged that the input timing of the data pulse 15 does not satisfy the set up value. In the simulation process performed in the first simulation stage, as shown in FIG. 6, because the pulse time difference 18 is set to the initial setting value 26 (indicated by a simulation stage number (1) in FIG. 6) which is sufficiently high, the affirmative judgment is obtained.

Thereafter, in the simulation result analyzing unit 5, it is judged in the convergence judging process (step ST5) whether or not a changing degree of the pulse time difference 18 is within a prescribed range.

Figure 6:
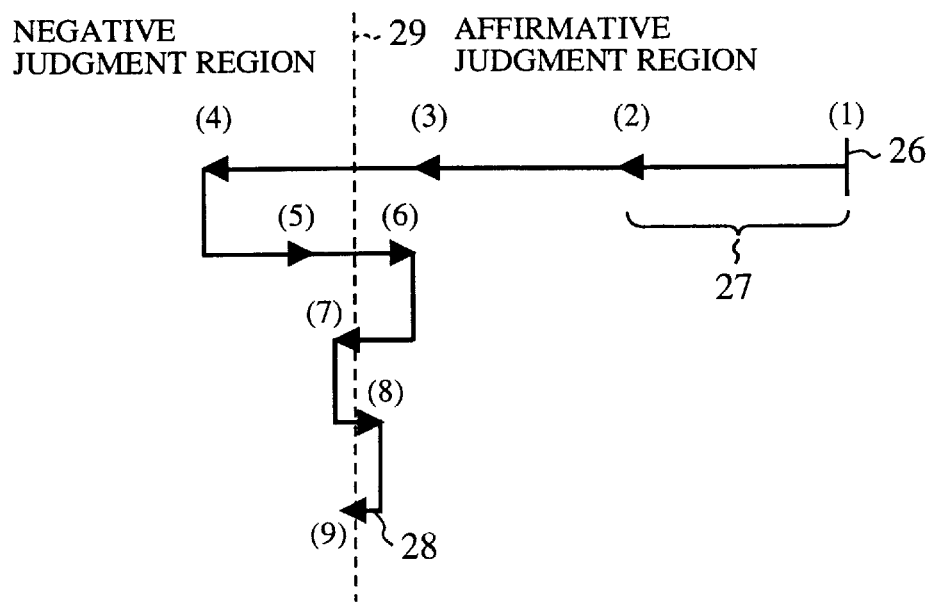
FIG. 6 is an explanatory view showing a pulse time difference and a changing degree of the pulse time difference which change every simulation stage while making the pulse time difference approach a set up truth value and reducing the changing degree of the pulse time difference.

FIG. 6 is an explanatory view showing the pulse time difference and the changing degree of the pulse time difference which change every simulation stage while making the pulse time difference approach a set up truth value and reducing the changing degree of the pulse time difference. In FIG. 6, a reference numeral 26 indicates the initial setting value of the pulse time difference 18 written in the waveform table 1, a reference numeral 27 indicates an initial changing degree of the pulse time difference 18, a reference numeral 28 indicates a minimum changing degree of the pulse time difference 18 which satisfies a prescribed range denoting the convergence condition written in the waveform table 1, and a reference numeral 29 indicates a set up truth value of the pulse time difference 18 to be idealistically extracted as a timing verification checking value.

As shown in FIG. 6, because a changing degree of the pulse time difference 18 is set to the initial changing degree 27 in the first simulation stage, the changing degree of the pulse time difference 18 is not within the prescribed range. Therefore, the convergence condition is not satisfied.

Thereafter, in the simulation result analyzing unit 5, an optimum simulation completion time is determined in the optimum simulation completion time determining process (step ST6) to check the level of the output pulse 17 at the optimum simulation completion time in simulation stages following the first simulation stage.

Figure 8:
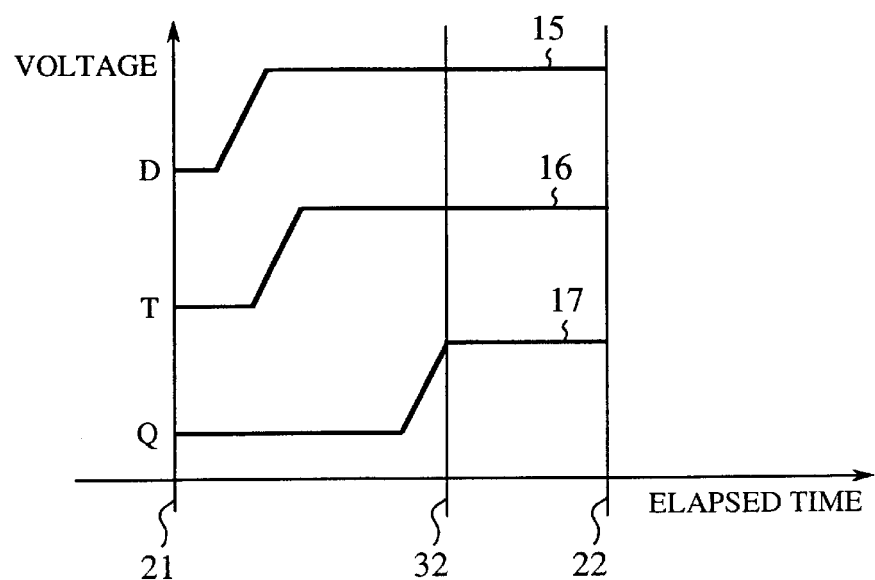
FIG. 8 is an explanatory view showing the determination of an optimum simulation completion time at which a level of the output pulse is checked.

FIG. 8 is an explanatory view showing the determination of an optimum simulation completion time at which a level of the output pulse is checked. In FIG. 8, a reference numeral 32 indicates an optimum simulation completion time at which the output pulse 17 is stably maintained to a high level in response to the level change of the data pulse 15 and the clock pulse 16. A level change time of the data pulse 15, a level change time of the clock pulse 16 and a level change time of the output pulse 17 are respectively measured in the first simulation stage, and it is detected that the level of the output pulse 17 is stably maintained to a high level after the data pulse 15 and the clock pulse 16 are respectively maintained to a high level. Therefore, in cases where the output pulse 17 is heightened to a constant level at a level change time, the optimum simulation completion time is, for example, determined on condition that a simulation time period between the simulation start time and the optimum simulation completion time is equal to 1.05 times of a simulation time period between the simulation start time and the level change time of the output pulse 17. Therefore, the simulation time period between the simulation start time and the optimum simulation completion time is considerably reduced as compared with a simulation time period between the simulation start time and the simulation completion time initially set.

The reason that the optimum simulation completion time is adopted in place of the level change time is as follows. In cases where the pulse time difference 18 approaches the set up truth value 29, the level change of the output pulse 17 becomes slow. In this embodiment, even though the level change of the output pulse 17 becomes slow, the judgment in the simulation process (step ST4) is stably performed.

Thereafter, the pulse time difference resetting process (step ST7) is performed in the simulation input data producing unit 3. In this process, a setting value of the pulse time difference 18 set in the pulse producing process (step ST3) is changed according to the judgment performed in the simulation process (step ST4), and a changing degree of the pulse time difference set in the pulse producing process (step ST3) is reduced in cases where the affirmative (or negative) judgment of the simulation process obtained in a preceding simulation stage changes to the negative (or affirmative) judgment in a current simulation stage.

More precisely, as shown in FIG. 6, in cases where the affirmative judgment of the simulation process is obtained in both preceding and current simulation stages, the setting value of the pulse time difference 18 is decreased by the changing degree of the pulse time difference 18, and the changing degree of the pulse time difference 18 is maintained. Also, in cases where the affirmative judgment of the simulation process obtained in a preceding simulation stage changes to the negative judgment in a current simulation stage, because the set up truth value 29 exists between a pulse time difference in the preceding simulation stage and a pulse time difference in the current simulation stage, the changing degree of the pulse time difference 18 is halved, and the setting value of the pulse time difference 18 is increased by the halved changing degree. Also, in cases where the negative judgment of the simulation process is obtained in both preceding and current simulation stages, the setting value of the pulse time difference 18 is increased by the changing degree of the pulse time difference 18, and the changing degree of the pulse time difference 18 is maintained. Also, in cases where the negative judgment of the simulation process obtained in a preceding simulation stage changes to the affirmative judgment in a current simulation stage, because the set up truth value 29 exists between pulse time differences of the preceding and current simulation stages, the changing degree of the pulse time difference 18 is halved, and the setting value of the pulse time difference 18 is decreased by the halved changing degree. Also, when the affirmative judgment of the simulation process is obtained in the first simulation stage, the initial setting value of the pulse time difference 18 is decreased by the initial changing degree of the pulse time difference 18, and the initial changing degree of the pulse time difference 18 is maintained.

Thereafter, the pulse producing process (step ST3) is again performed in a second simulation stage. In this process, the data pulse 15 and the clock pulse 16 are produced so as to satisfy the setting value of the pulse time difference 18 and the changing degree of the pulse time difference 18 reset in the pulse time difference resetting process (step ST7). Thereafter, the simulation process (step ST4) and the convergence judging process (step ST5) are performed in the second simulation stage. In this case, the checking of a level of the output pulse 17 output from the D type flip-flop circuit 11 is performed at the optimum simulation completion time 32 in the second simulation stage. Because the simulation time period between the simulation start time and the optimum simulation completion time is considerably reduced as compared with the simulation time period between the simulation start time and the simulation completion time initially set, the simulation time required in the simulation process (step ST4) is considerably reduced in the second simulation stage and simulation stages following the second simulation stage.

In cases where the convergence condition is not satisfied in the convergence judging process (step ST5), the pulse time difference resetting process (step ST7) is again performed, and the pulse producing process (step ST3), the simulation process (step ST4) and the convergence judging process (step ST5) are again performed in each of simulation stages following the second simulation stage in the same manner as in the second simulation stage. In this case, the optimum simulation completion time determining process (step ST6) is not performed because the optimum simulation completion time has been already determined.

Therefore, because the setting value of the pulse time difference 18 and the changing degree of the pulse time difference 18 are repeatedly reset in the pulse time difference resetting process to make the setting value of the pulse time difference 18 approach the set up truth value 29, it is finally judged in the convergence judging process (step ST5) that a changing degree of the pulse time difference 18 is within the prescribed range, and the convergence condition is satisfied.

Thereafter, the checking value extracting process (step ST8) is performed in the simulation result analyzing unit 5.

That is, in cases where the affirmative judgment is obtained in the simulation process of the final simulation stage, because the setting value of the pulse time difference 18 finally reset in the pulse time difference resetting process (step ST7) can be adopted as the set up value, the setting value of the pulse time difference 18 finally reset is extracted as a timing verification checking value denoting a set up value. Also, in cases where the negative judgment is obtained in the simulation process of the final simulation stage, because the setting value of the pulse time difference 18 finally reset in the pulse time difference resetting process (step ST7) cannot be adopted as the set up value, the setting value of the pulse time difference 18 reset in the pulse time difference resetting process (step ST7) in a specific simulation stage (usually just before the final simulation stage), in which the affirmative judgment is finally obtained in the simulation process, is extracted as a timing verification checking value denoting a set up value.

Next, a method for extracting the pulse time difference 18 as a timing verification checking value denoting a hold value is described.

As shown in FIG. 6, in cases where the pulse time difference 18 placed in an affirmative judgment rejoin is decreased to place the pulse time difference 18 in a negative judgment rejoin, though the pulse time difference 18 between the data pulse 15 and the clock pulse 16 is shortened, the clock pulse 16 is always input to the D type flip-flop circuit 11 after the data pulse 15 is input to the D type flip-flop circuit 11. However, in the method for extracting a timing verification checking value as a hold value, the clock pulse 16 is input to the D type flip-flop circuit 11 before the data pulse 15 is input to the D type flip-flop circuit 11. Because the initial setting value of the pulse time difference 18 makes the clock pulse 16 be input to the D type flip-flop circuit 11 after the data pulse 15 is input to the D type flip-flop circuit 11, even though the pulse time difference 18 placed in the affirmative judgment rejoin is changed to the negative judgment rejoin, the pulse time difference 18 is still decreased to make the clock pulse 16 still approach the data pulse 15, and the inputting of the clock pulse 16 become earlier than the inputting of the data pulse 15. In this case, the pulse time difference 18, which is defined as a subtracted value obtained by subtracting an input time of the data pulse 15 from an input time of the clock pulse 16, is decreased to a negative value. Though the pulse time difference 18 is still placed in the negative judgment rejoin when the inputting of the clock pulse 16 becomes earlier than the inputting of the data pulse 15, the pulse time difference 18 is still decreased to make the inputting of the clock pulse 16 sufficiently become earlier than the inputting of the data pulse 15. Therefore, a level of the output pulse 16 again becomes higher than the reference voltage 23 at the simulation completion time, and the decreased pulse time difference 18 becomes placed in another affirmative judgment region. Therefore, the method for extracting a timing verification checking value as a hold value can be performed.

Figure 7:
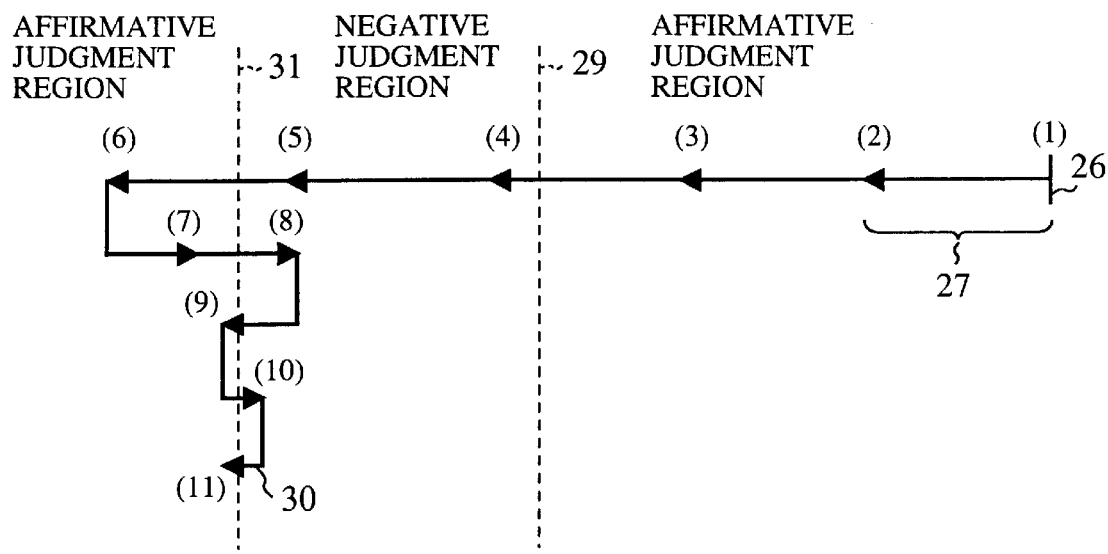
FIG. 7 is an explanatory view showing a pulse time difference and a changing degree of the pulse time difference which change every simulation stage while making the pulse time difference approach a hold truth value and reducing the changing degree of the pulse time difference.

FIG. 7 is an explanatory view showing the pulse time difference 18 and the changing degree of the pulse time difference 18 which change every simulation stage while making the pulse time difference 18, which passes through the set up truth value 29, approach a hold truth value and reducing the changing degree of the pulse time difference. In FIG. 7, a reference numeral 30 indicates a minimum changing degree of the pulse time difference 18 which satisfies a prescribed range denoting the convergence condition written in the waveform table 1, and a reference numeral 31 indicates a hold truth value of the pulse time difference 18 to be idealistically extracted as a timing verification checking value denoting a hold value. The pulse time difference resetting process (step ST7) performed in the simulation input data producing unit 3 differs from that in the method for extracting the pulse time difference 18 as a timing verification checking value denoting a set up value. That is, as shown in FIG. 7, in cases where the affirmative judgment of the simulation process is obtained in both preceding and current simulation stages in case of the pulse time difference 18 set to a positive value, the setting value of the pulse time difference 18 is decreased by the changing degree of the pulse time difference 18, and the changing degree of the pulse time difference 18 is maintained. Also, in cases where the affirmative judgment of the simulation process obtained in a preceding simulation stage changes to the negative judgment in a current simulation stage at the first time, the setting value of the pulse time difference 18 is decreased by the changing degree of the pulse time difference 18, and the changing degree of the pulse time difference 18 is maintained. Also, in cases where the negative judgment of the simulation process is obtained in both preceding and current simulation stages, the setting value of the pulse time difference 18 is decreased by the changing degree of the pulse time difference 18, and the changing degree of the pulse time difference 18 is maintained. Also, in cases where the negative judgment of the simulation process obtained in a preceding simulation stage changes to the affirmative judgment in a current simulation stage, because the hold truth value 31 exists between a pulse time difference in the preceding simulation stage and a pulse time difference in the current simulation stage, the changing degree of the pulse time difference 18 is halved, and the setting value of the pulse time difference 18 is increased by the halved changing degree. Also, in cases where the affirmative judgment of the simulation process is obtained in both preceding and current simulation stages in case of the pulse time difference 18 set to a negative value, the setting value of the pulse time difference 18 is increased by the changing degree of the pulse time difference 18, and the changing degree of the pulse time difference 18 is maintained. Also, in cases where the affirmative judgment of the simulation process obtained in a preceding simulation stage changes to the negative judgment in a current simulation stage after the pulse time difference 18 is set to a negative value, because the hold truth value 31 exists between pulse time differences of the preceding and current simulation stages, the changing degree of the pulse time difference 18 is halved, and the setting value of the pulse time difference 18 is decreased by the halved changing degree. Also, when the affirmative judgment of the simulation process is obtained in the first simulation stage, the initial setting value of the pulse time difference 18 is decreased by the initial changing degree of the pulse time difference 18, and the initial changing degree of the pulse time difference 18 is maintained.

Thereafter, because the simulation process (step ST4) is performed according to the setting value of the pulse time difference 18 and the changing degree of the pulse time difference 18 reset in the pulse time difference resetting process (step ST7), the setting value of the pulse time difference 18 approaches the hold truth value 31, it is finally judged in the convergence judging process (step ST5) that a changing degree of the pulse time difference 18 is within the prescribed range, and the convergence condition is satisfied.

This embodiment is not limited to the pulse time difference 18. Therefore, a method for extracting a pulse width of a clock pulse as a timing verification checking value is described.

Figure 4:
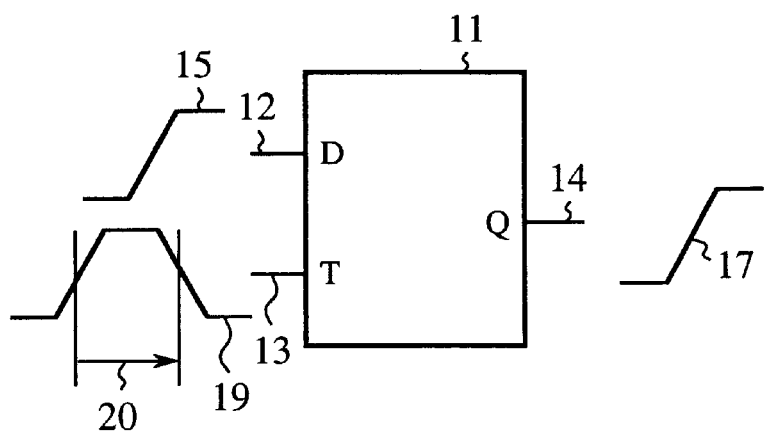
FIG. 4 is an explanatory view showing a pulse width of an input pulse supplied to a to-be-timing-verified circuit and an output pulse output from the to-be-timing-verified circuit.

FIG. 4 is an explanatory view showing a pulse width of an input pulse supplied to a to-be-timing-verified circuit and an output pulse output from the to-be-timing-verified circuit. In FIG. 4, a reference numeral 19 indicates a clock pulse to be supplied to the clock input terminal 13 of the D type flip-flop circuit 11, and a reference numeral 20 indicates a pulse width of the clock pulse 19.

In this method, waveforms of the data pulse 15 and the clock pulse 19 to be supplied to the D type flip-flop circuit 11, an initial setting value of the pulse width 20 of the clock pulse 19, an initial changing degree of the pulse width 20, a simulation completion time 22 and a convergence condition 23 of the pulse width 20 are written in the waveform table 1 (step ST1). Also, the circuit connection information 2 is prepared (step ST2). Thereafter, the data pulse 15 and the clock pulse 16 to be supplied to the D type flip-flop circuit 11 are produced according to the waveform table 1 and the circuit connection information 2 in the pulse producing process (step ST3).

Thereafter, as shown in FIG. 4, the data pulse 15 and the clock pulse 16 are supplied to the D type flip-flop circuit 11, a level of the output pulse 17 output from the output terminal 14 of the D type flip-flop circuit 11 is checked at the simulation completion time 22 in the simulation process (step ST4) of the first simulation stage, and the convergence condition of the output pulse 17 is judged in the convergence judging process (step ST5). In cases where the convergence condition of the output pulse 17 is not satisfied, the optimum simulation completion time 32 is determined in the optimum simulation completion time determining process (step ST6), the pulse width 20 is decreased in the same manner as the decrease of the pulse time difference 18 in the pulse time difference resetting process (step ST7), the pulse producing process (step ST3) and the simulation process (step ST4) are again performed, and the level of the output pulse 17 is checked at the optimum simulation completion time 32. Because the steps ST3 to ST7 are repeatedly performed while decreasing the pulse width 20, the pulse width 20 of the output pulse 17 is set to be within a prescribed range, and the convergence condition of the output pulse 17 is finally satisfied in the convergence judging process (step ST5). Thereafter, the pulse width 20 corresponding to the final affirmative judgment of the circuit simulator 4 is extracted as a timing verification checking value 6.

In the first embodiment, the optimum simulation completion time 32 is determined according to a level change time at which the output pulse 17 is stably set to a high level in the simulation process of the first simulation stage, and no optimum simulation completion time is again determined in the simulation stages following the first simulation stage. However, it is applicable that the optimum simulation completion time 32 be renewed according to the simulation result each time the simulation process is performed.

Also, in the first embodiment, it is applicable that the optimum simulation completion time 32 be renewed according to the simulation result each time the simulation process is performed in one of a plurality of prescribed simulation stages.

Accordingly, in the first embodiment, the optimum simulation completion time 32 is determined in the optimum simulation completion time determining process (step ST6) according to a level change time at which the output pulse 17 is stably set to a high level after the stable high levels of the data and clock pulses 15 and 16 in the simulation process of the first simulation stage, and the simulation process (step ST4) is performed according to the optimum simulation completion time 32 in each simulation stage following the first simulation stage. Therefore, a simulation time required for the simulation process can be considerably shortened. As a result, the pulse time difference 18 (or the pulse width 20 of the clock pulse 19) can be reliably and rapidly converged, and the timing verification checking value 6 can be reliably and rapidly extracted.

Embodiment 2

Figure 9:
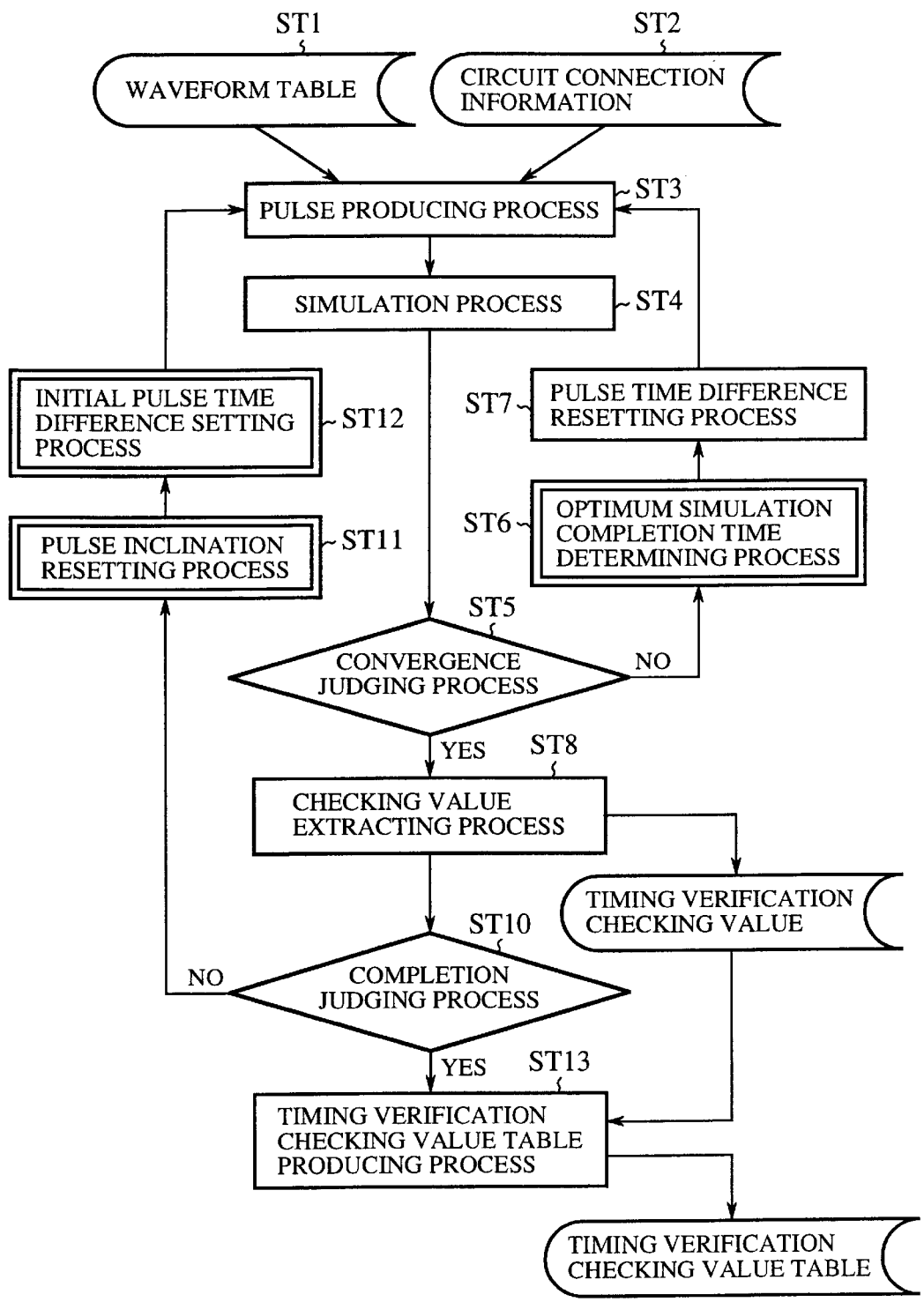
FIG. 9 is a flow chart showing a timing verification checking value extracting method, which is performed in the timing verification checking value extracting apparatus shown in FIG. 1, according to a second embodiment of the present invention.

FIG. 9 is a flow chart showing a timing verification checking value extracting method, which is performed in the timing verification checking value extracting apparatus shown in FIG. 1, according to a second embodiment of the present invention.

Figures 10, 11:
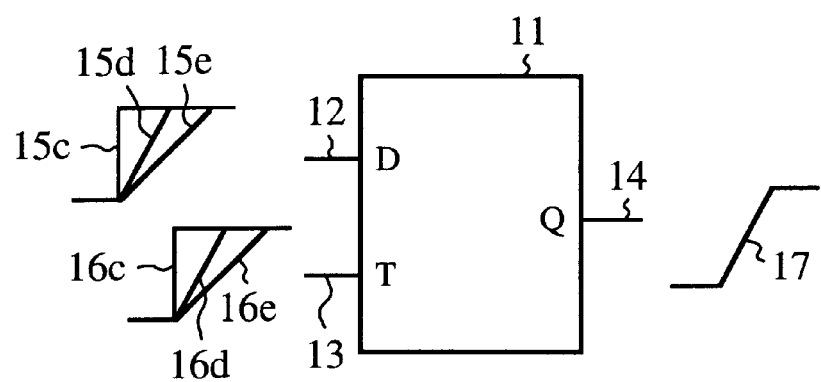
FIG. 10 is an explanatory view showing a pulse time difference of input pulses, which respectively have one of a plurality of inclinations, to be supplied to a to-be-timing-verified circuit.
FIG. 11 is an explanatory view showing a table of timing verification checking values.

FIG. 10 is an explanatory view showing a pulse time difference of input pulses, which respectively have one of a plurality of inclinations, to be supplied to a to-be-timing-verified circuit. In FIG. 10, reference numerals 15c to 15e respectively indicate a data pulse, of which a leading edge has an inclination, to be supplied to the data input terminal 12 of the D type flip-flop circuit 11. Reference numerals 16c to 16e respectively indicate a clock pulse, of which a leading edge has an inclination, to be supplied to the clock input terminal 13 of the D type flip-flop circuit 11. The inclination of each pulse is indicated by a level changing time (nanosecond, hereinafter indicated by a sign "ns") required to heighten the low level of the pulse to the high level. The inclination of the pulses 15c and 16c substantially corresponds to 0.0 (ns), the inclination of the pulses 15d and 16d corresponds to 1.0 (ns), and the inclination of the pulses 15e and 16e corresponds to 2.0 (ns).

FIG. 11 is an explanatory view showing a table of timing verification checking values. In FIG. 11, a reference numeral 35 indicates a timing verification checking value extracted in cases where the data pulse 15c having the inclination of 0.0 (ns) and the clock pulse 16c having the inclination of 0.0 (ns) are supplied to the D type flip-flop circuit 11, a reference numeral 36 indicates a timing verification checking value extracted in cases where the data pulse 15e having the inclination of 2.0 (ns) and the clock pulse 16c having the inclination of 0.0 (ns) are supplied to the D type flip-flop circuit 11, a reference numeral 37 indicates a timing verification checking value extracted in cases where the data pulse 15c having the inclination of 0.0 (ns) and the clock pulse 16e having the inclination of 2.0 (ns) are supplied to the D type flip-flop circuit 11, and a reference numeral 38 indicates a timing verification checking value extracted in cases where the data pulse 15d having the inclination of 1.0 (ns) and the clock pulse 16c having the inclination of 0.0 (ns) are supplied to the D type flip-flop circuit 11.

A timing verification checking value extracting method, in which an inclination of each input pulse (the data pulse and the clock pulse) is changed, is described with reference to FIG. 1, FIG. 9, FIG. 10 and FIG. 11.

In the simulation input data producing unit 3, as shown in FIG. 10, the data pulse 15c and the clock pulse 16c to be supplied to the D type flip-flop circuit 11 are produced according to the waveform table 1 and the circuit connection information 2 in the pulse producing process (step ST3). Therefore, the pulses 15c and 16c respectively having the inclination of 0.0 (ns) are produced in the same manner as in the first embodiment.

Thereafter, the steps ST4 to ST8 are performed in the same manner as in the first embodiment. Therefore, as shown in FIG. 11, in cases where the data pulse 15c and the clock pulse 16c respectively having the inclination of 0.0 (ns) are supplied to the D type flip-flop circuit 11, a pulse time difference set to 1.0 (ns), which denotes a set up value, is extracted as a timing verification checking value 35 in a first extraction stage.

Thereafter, in the simulation result analyzing unit 5, it is judged in a completion judging process (step ST10) whether or not all timing verification checking values denoting set up values are extracted in response to the data pulses and the clock pulses of all inclinations. Because all timing verification checking values written in the table of FIG. 11 are not extracted, the procedure proceeds to a pulse inclination resetting process (step ST11).

In the simulation input data producing unit 3, because the inclinations of the data pulse 15c and the clock pulse 16c are respectively set to a low value (0.0 (ns)) in the first extraction stage, a set of data and clock pulses corresponding to a high-valued inclination is selected in the pulse inclination resetting process (step ST11). For example, the data pulse 15e having the inclination of 2.0 (ns) and the clock pulse 16c having the inclination of 0.0 (ns) are selected.

Thereafter, in the simulation input data producing unit 3, the initial setting value of the pulse time difference written in the waveform table 1 is set as a value of the pulse time difference in an initial pulse time difference setting process (step ST12), and the data pulse 15e and the clock pulse 16c selected in the pulse inclination resetting process (step ST11) are produced according to the waveform table 1 and the circuit connection information 2 in the pulse producing process (step ST3). Thereafter, the steps ST4 to ST8 are performed. Therefore, as shown in FIG. 11, in cases where the data pulse 15e having the inclination of 2.0 (ns) and the clock pulse 16c having the inclination of 0.0 (ns) are supplied to the D type flip-flop circuit 11, a pulse time difference set to 1.5 (ns), which denotes a set up value, is extracted as a timing verification checking value 36 in a second extraction stage.

Thereafter, because it is judged in the completion judging process (step ST10) that all timing verification checking values written in the table of FIG. 11 are not extracted, a set of data and clock pulses corresponding to another high-valued inclination is selected in the pulse inclination resetting process (step ST11). For example, the data pulse 15c having the inclination of 0.0 (ns) and the clock pulse 16e having the inclination of 2.0 (ns) are selected. Thereafter, the initial setting value of the pulse time difference written in the waveform table 1 is set as a value of the pulse time difference in the initial pulse time difference setting process. (step ST12), the data pulse 15c and the clock pulse 16e selected in the pulse inclination resetting process (step ST11) are produced according to the waveform table 1 and the circuit connection information 2 in the pulse producing process (step ST3), and the steps ST4 to ST8 are performed. Therefore, as shown in FIG. 11, in cases where the data pulse 15c having the inclination of 0.0 (ns) and the clock pulse 16e having the inclination of 2.0 (ns) are supplied to the D type flip-flop circuit 11, a pulse time difference set to 1.3 (ns), which denotes a set up value, is extracted as a timing verification checking value 37 in a third extraction stage.

Thereafter, because the timing verification checking values 35, 36 and 37 are extracted in response to the sets of data and clock pulses corresponding to the low-valued inclination and the high-valued inclination in the first to third extraction stages, a set of data and clock pulses corresponding to a middle inclination between the low-valued inclination and high-valued inclination is selected in the pulse inclination resetting process (step ST11). For example, the data pulse 15*d* having the inclination of 1.0 (ns) and the clock pulse 16*c* having the inclination of 0.0 (ns) are selected.

Thereafter, in the initial pulse time difference setting process (step ST12), because the combination of the data pulse 15*d* and the clock pulse 16*c* is placed between the combination of the data pulse 15*c* and the clock pulse 16*c* corresponding to the first extraction stage and the combination of the data pulse 15*e* and the clock pulse 16*c* corresponding to the second extraction stage, an initial pulse time difference between the data pulse 15*d* and the clock pulse 16*c* is automatically set according to the timing verification checking value 35 extracted in the first extraction stage and the timing verification checking value 36 extracted in the second extraction stage. That is, because it can be assumed that an optimum initial pulse time difference between the data pulse 15*d* and the clock pulse 16*c* is placed between the timing verification checking values 35 and 36, an initial pulse time difference between the data pulse 15*d* and the clock pulse 16*c* is automatically set to an average value (1.25 (ns)) of the timing verification checking values 35 and 36.

Thereafter, the data pulse 15*d* and the clock pulse 16*c* selected in the pulse inclination resetting process (step ST11) are produced according to the initial pulse time difference set to the average value (1.25 (ns)), the waveform table 1 and the circuit connection information 2 in the pulse producing process (step ST3). Therefore, a pulse time difference between the data pulse 15*d* and the clock pulse 16*c* is not set to the initial setting value 26 written in the waveform table 1 but is set to the average value (1.25 (ns)). Thereafter, the steps ST4 to ST8 are performed, and a pulse time difference set to 1.2 (ns), which denotes a set up value, is extracted as a timing verification checking value 38 in a fourth extracting stage.

Thereafter, it is judged in the completion judging process (step ST10) that all timing verification checking values written in the table of FIG. 11 are extracted, and the table of timing verification checking values shown in FIG. 11 is prepared in a timing verification checking value table producing process (step ST13).

In the second embodiment, the method for extracting the timing verification checking values denoting set up values is described. However, it is applicable that the method be applied for the extraction of timing verification checking values denoting hold values.

Also, the method of the second embodiment is not limited to the pulse time difference. That is, it is applicable that the method be applied for the extraction of timing verification checking values denoting pulse widths of clock pulses.

Accordingly, in the second embodiment, in cases where the combination of input pulses (data and clock pulses) corresponding to a middle inclination, which are set in the pulse inclination resetting process (step ST11), is placed between the combination of input pulses corresponding to a low-valued inclination and the combination of input pulses corresponding to a high-valued inclination, because an initial pulse time difference between the input pulses is set in the initial pulse time difference setting process (step ST12) according to the timing verification checking value corresponding to the input pulses of the low-valued inclination and the timing verification checking value corresponding to the input pulses of the high-valued inclination, a convergence time required to obtain a timing verification checking value satisfying the convergence condition for the input pulses corresponding to the middle inclination can be shortened. Therefore, the timing verification checking value 38 corresponding to the middle inclination can be rapidly extracted.

Embodiment 3

Figure 12:
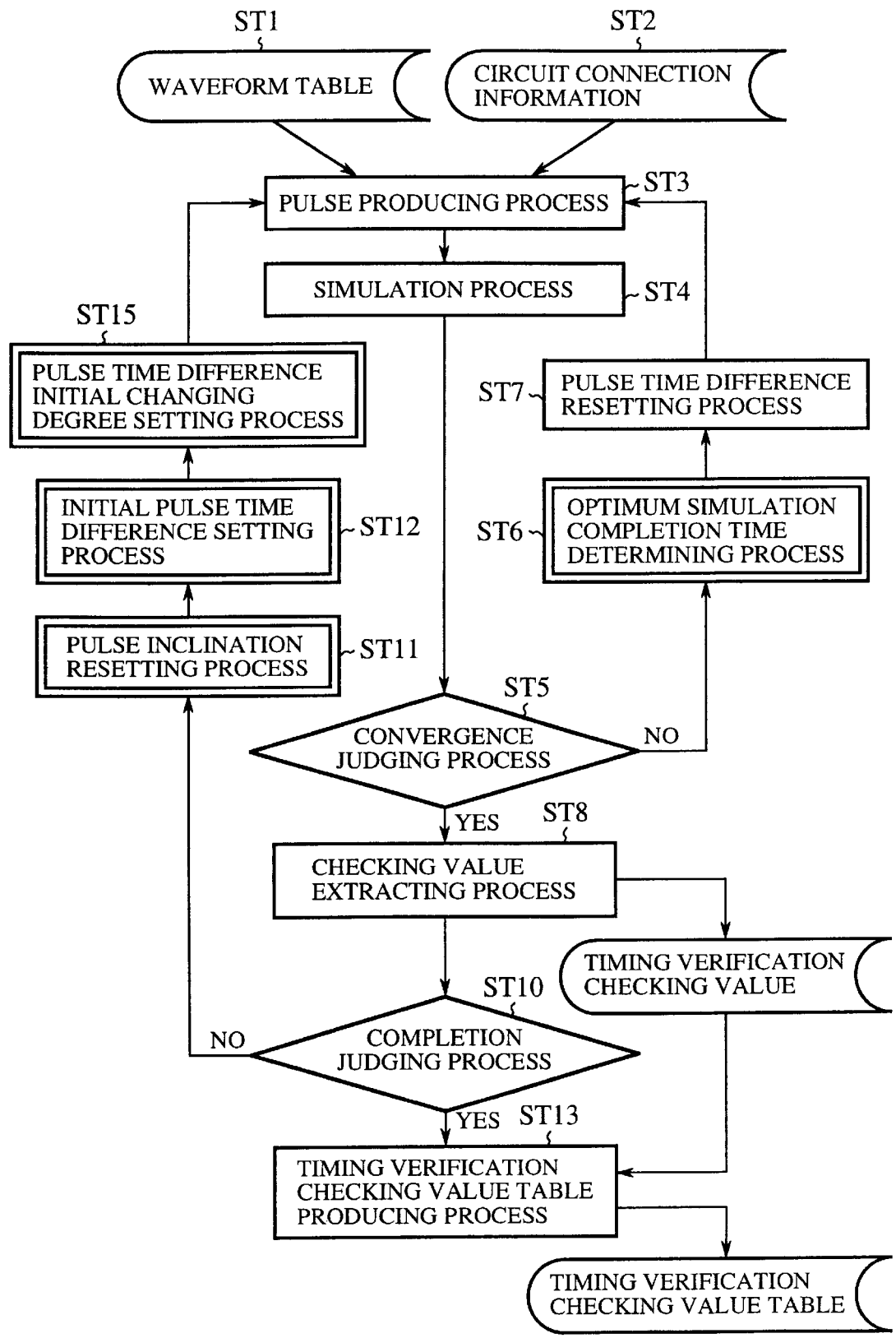
FIG. 12 is a flow chart showing a timing verification checking value extracting method, which is performed in the timing verification checking value extracting apparatus shown in FIG. 1, according to a third embodiment of the present invention.

FIG. 12 is a flow chart showing a timing verification checking value extracting method, which is performed in the timing verification checking value extracting apparatus shown in FIG. 1, according to a third embodiment of the present invention.

A timing verification checking value extracting method is described with reference to FIG. 12.

In a third embodiment, in cases where the combination of input pulses (for example, the data pulse 15*d* having the inclination of 1.0 (ns) and the clock pulse 16*c* having the inclination of 0.0 (ns) shown in FIG. 10) corresponding to a middle inclination between a high-valued inclination and a low-valued inclination is selected in the pulse inclination resetting process (step ST11) after the timing verification checking values 35, 36 and 37 shown in FIG. 11 are extracted in the checking value extracting process (step ST8) in response to the combination of input pulses corresponding to the low-valued inclination and the combination of input pulses corresponding to the high-valued inclination, an initial changing degree of a pulse time difference between the input pulses corresponding to the middle inclination is set in a pulse time difference initial changing degree setting process (step ST15) according to the initial pulse time difference set for the combination of the input pulses corresponding to the middle inclination in the initial pulse time difference setting process (step ST12) and the timing verification checking value 35 or 36 corresponding to the low-valued inclination or the high-valued inclination.

More precisely, in cases where the timing verification checking value 38 is extracted after the extraction of the timing verification checking values 35, 36 and 37 shown in FIG. 11, because it can be assumed that the timing verification checking value 38 is placed between the timing verification checking values 35 and 36, an initial changing degree of a pulse time difference between the data pulse 15*d* and the clock pulse 16*c* corresponding to the middle inclination is set to an average value of both the initial pulse time difference set for the combination of the data pulse 15*d* and the clock pulse 16*c* corresponding to the middle inclination in the initial pulse time difference setting process (step ST12) and the timing verification checking value 35 or 36.

Thereafter, the steps ST3 to ST7 are repeatedly performed in the fourth extraction stage. In this case, the data pulse 15*d* and the clock pulse 16*c* are produced in the pulse producing process (step ST3) in the same manner as in the second embodiment, and the pulse time difference between the data pulse 15*d* and the clock pulse 16*c* is decreased in the simulation process (step ST4) of the first simulation stage while using the initial changing degree set in the pulse time difference initial changing degree setting process (step ST15) in place of the initial changing degree 27 written in the waveform table 1. Thereafter, the timing verification checking value 38, which is set to 1.2 (ns), is extracted in the checking value extracting process (step ST8).

Accordingly, in the third embodiment, in cases where the input pulses corresponding to a middle inclination between a low-valued inclination and a high-valued inclination is selected in the pulse inclination resetting process (step ST11), because an initial changing degree of a pulse time difference between the input pulses corresponding to the middle inclination is set in the pulse time difference initial changing degree setting process (step ST15) according to the initial pulse time difference set for the input pulses corresponding to the middle inclination in the initial pulse time difference setting process (step ST12) and the timing verification checking value 35 or 36 corresponding to the low-valued inclination or the high-valued inclination, a convergence time required to obtain a timing verification checking value satisfying the convergence condition for the input pulses corresponding to the middle inclination can be shortened. Therefore, the timing verification checking value 38 corresponding to the middle inclination can be rapidly extracted.

Embodiment 4

Figure 13:
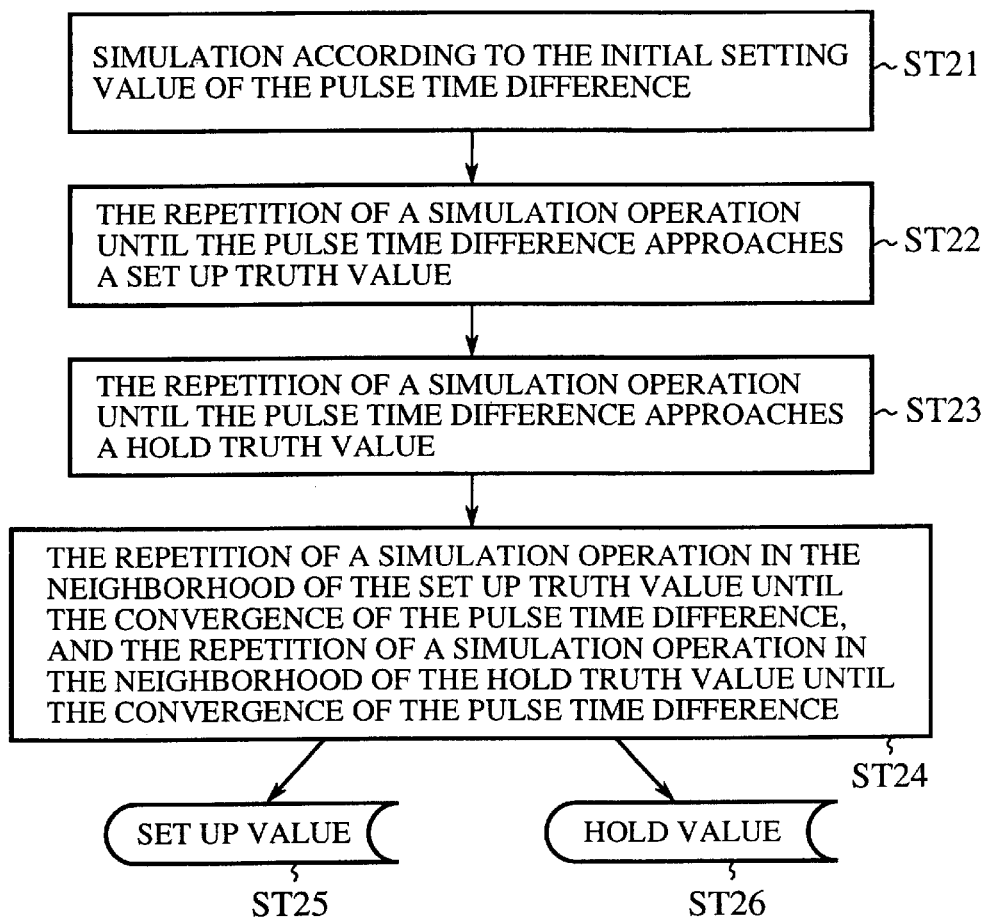
FIG. 13 is a flow chart showing a timing verification checking value extracting method, which is performed in the timing verification checking value extracting apparatus shown in FIG. 1, according to a fourth embodiment of the present invention.

FIG. 13 is a flow chart showing a timing verification checking value extracting method, which is performed in the timing verification checking value extracting apparatus shown in FIG. 1, according to a fourth embodiment of the present invention.

Figure 14:
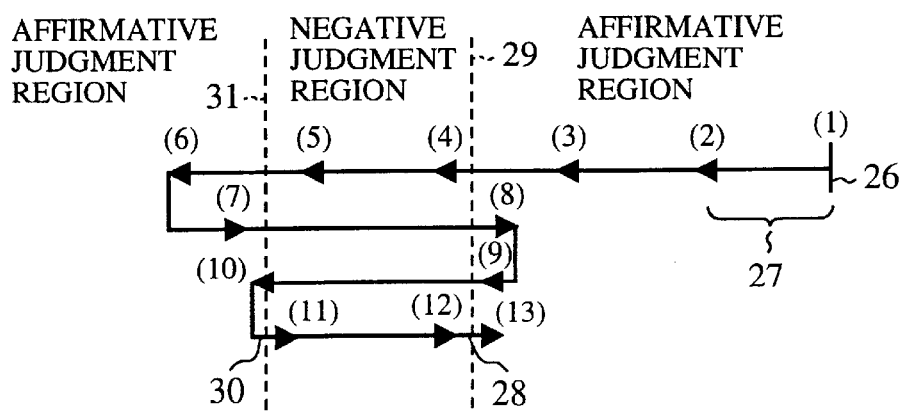
FIG. 14 is an explanatory view showing a pulse time difference and a changing degree of the pulse time difference which change every simulation stage to make the pulse time difference approach a hold truth value and to make the pulse time difference approach a set up truth value while reducing the changing degree of the pulse time difference.

FIG. 14 is an explanatory view showing a pulse time difference and a changing degree of the pulse time difference which change every simulation stage to make the pulse time difference approach the hold truth value 31 and to make the pulse time difference approach the set up truth value 29 while reducing the changing degree of the pulse time difference.

A timing verification checking value extracting method is described with reference to FIG. 2, FIG. 13 and FIG. 14.

In the first embodiment, the extraction of a timing verification checking value denoting a set up value and the extraction of a timing verification checking value denoting a hold value are separately performed. However, in a fourth embodiment, the extraction of a timing verification checking value denoting a set up value and the extraction of a timing verification checking value denoting a hold value are performed in the same extraction stage. The method according to the fourth embodiment is fundamentally performed according to the flow chart shown in FIG. 2, and characteristics of the method are indicated in the flow chart shown in FIG. 13.

That is, the pulse producing process (step ST3) and the simulation process (step ST4) are performed in the first simulation stage by using the initial setting value 26 of the pulse time difference 18 (step ST21 of FIG. 13). Thereafter, because the initial setting value 26 does not satisfy the convergence condition in the convergence judging process (step ST5), the optimum simulation completion time determining process (step ST6) is performed, and the pulse time difference resetting process (step ST7), the pulse producing process (step ST3), the simulation process (step ST4) and the convergence judging process (step ST5) are repeatedly performed in simulation stages following the first simulation stage until a negative judgment is performed in the circuit simulator 4 for the pulse time difference 18 decreased by the initial changing degree 27 every simulation stage (step ST22 of FIG. 13). In this embodiment, the negative judgment is performed in the circuit simulator 4 in the fourth simulation stage. Therefore, it is realized in the simulation result analyzing unit 5 that the set up truth value 29 exists between the pulse time difference 18 in the third simulation stage and the pulse time difference 18 in the fourth simulation stage.

Thereafter, the steps ST7, ST3, ST4 and ST5 are repeatedly performed until a positive judgment is performed in the circuit simulator 4 for the pulse time difference 18 which is still decreased by the initial changing degree 27 every simulation stage and reaches a negative value (step ST23 of FIG. 13). In this embodiment, the positive judgment is performed in the circuit simulator 4 in the sixth simulation stage. Therefore, it is realized in the simulation result analyzing unit 5 that the hold truth value 31 exists between the pulse time difference 18 in the fifth simulation stage and the pulse time difference 18 in the sixth simulation stage.

Thereafter, the steps ST7, ST3, ST4 and ST5 are repeatedly performed while increasing or decreasing the pulse time difference 18 and the changing degree of the pulse time difference 18 every simulation stage in the pulse time difference setting process (step ST7) to make the pulse time difference 18 approach the set up truth value 29 and to make the pulse time difference 18 approach the hold truth value 31 (step ST24 of FIG. 13). Thereafter, in cases where the changing degree of the pulse time difference 18 sufficiently approaching the set up truth value 29 becomes within the prescribed range, it is judged in the convergence judging process (step ST5) that the pulse time difference 18 sufficiently approaching the set up truth value 29 satisfies the convergence condition, and the pulse time difference 18, for which the affirmative judgment is finally performed in the circuit simulator 4 on condition that the pulse time difference 18 is set to a positive value, is extracted as a timing verification checking value denoting a set up value (step ST25 of FIG. 13). Also, in cases where the changing degree of the pulse time difference 18 sufficiently approaching the hold truth value 31 becomes within the prescribed range, it is judged in the convergence judging process (step ST5) that the pulse time difference 18 sufficiently approaching the hold truth value 31 satisfies the convergence condition, and the pulse time difference 18, for which the affirmative judgment is finally performed in the circuit simulator 4 on condition that the pulse time difference 18 is set to a negative value, is extracted as a timing verification checking value denoting a hold value (step ST26 of FIG. 13).

In this embodiment shown in FIG. 14, the operation from the seventh simulation stage to the thirteenth simulation stage is performed in the step ST24. That is, after the sixth simulation stage is performed, the changing degree of the pulse time difference 18 is halved, the pulse time difference 18 is increased by the halved changing degree to make the pulse time difference 18 approach the hold truth value 31, and an affirmative judgment is performed in the step ST4 for the pulse time difference 18 which is recently renewed and is set to a negative value, in the seventh simulation stage. Thereafter, the pulse time difference 18 is increased to an average value between the pulse time difference 18 of the third simulation stage and the pulse time difference 18 of the fourth simulation stage to make the pulse time difference 18 approach the set up truth value 29, and an affirmative judgment is performed in the step ST4 for the pulse time difference 18 which is recently renewed and is set to a positive value, in the eighth simulation stage. Thereafter, the pulse time difference 18 is decreased to an average value between the pulse time difference 18 of the fourth simulation stage and the pulse time difference 18 of the eighth simulation stage to make the pulse time difference 18 approach the set up truth value 29, and an affirmative judgment is performed in the step ST4 for the pulse time difference 18 which is recently renewed and is set to a positive value, in the ninth simulation stage. Thereafter, the pulse time difference 18 is decreased to an average value between the pulse time difference 18 of the fifth simulation stage and the pulse time difference 18 of the seventh simulation stage to make the pulse time difference 18 approach the hold truth value 31, and an affirmative judgment is performed in the step ST4 for the pulse time difference 18 which is recently renewed and is set to a negative value, in the tenth simulation stage. Thereafter, the pulse time difference 18 is increased to an average value between the pulse time difference 18 of the fifth simulation stage and the pulse time difference 18 of the tenth simulation stage to make the pulse time difference 18 approach the hold truth value 31, and a negative judgment is performed in the step ST4 for the pulse time difference 18 which is recently renewed and is set to a negative value, in the eleventh simulation stage. Because the changing degree of the pulse time difference 18 of the eleventh simulation stage is within the prescribed range, the pulse time difference 18 of the tenth simulation stage is extracted as a timing verification checking value denoting a hold value (step ST25).

Thereafter, the pulse time difference 18 is increased to an average value between the pulse time difference 18 of the fourth simulation stage and the pulse time difference 18 of the ninth simulation stage to make the pulse time difference 18 approach the set up truth value 29, and a negative judgment is performed in the step ST4 for the pulse time difference 18 which is recently renewed and is set to a positive value, in the twelfth simulation stage. Thereafter, the pulse time difference 18 is increased to an average value between the pulse time difference 18 of the ninth simulation stage and the pulse time difference 18 of the twelfth simulation stage to make the pulse time difference 18 approach the set up truth value 29, and an affirmative judgment is performed in the step ST4 for the pulse time difference 18 which is recently renewed and is set to a positive value, in the thirteenth simulation stage. Because the changing degree of the pulse time difference 18 of the thirteenth simulation stage is within the-prescribed range, the pulse time difference 18 of the thirteenth simulation stage is extracted as a timing verification checking value denoting a set up value (step ST26).

Accordingly, in the fourth embodiment, because the pulse time difference 18 set to the initial setting value 26 in the pulse producing process (step ST3) is decreased by the initial changing degree 27 of the pulse time difference 18 every simulation stage in the pulse time difference resetting process (step ST7) until the affirmative judgment initially performed by the circuit simulator 4 is changed to the negative judgment in the simulation process (step ST4), the set up truth value 29 is roughly detected. Also, because the pulse time difference 18 is still decreased by the initial changing degree 27 of the pulse time difference 18 every simulation stage until the negative judgment of the circuit simulator 4 is changed to the affirmative judgment in the simulation process (step ST4), the hold truth value 31 is roughly detected. Also, because the pulse time difference 18 is changed in the neighborhood of the set up truth value 29 while reducing the changing degree of the pulse time difference 18 until the changing degree of the pulse time difference 18 becomes within the prescribed range in the convergence judging process (step ST5), the pulse time difference 18 sufficiently approaching the set up truth value 29 can be extracted as a timing verification checking value denoting a set up value. Also, because the pulse time difference 18 is changed in the neighborhood of the hold truth value 31 while reducing the changing degree of the pulse time difference 18 until the changing degree of the pulse time difference 18 becomes within the prescribed range in the convergence judging process (step ST5), the pulse time difference 18 sufficiently approaching the hold truth value 31 can be extracted as a timing verification checking value denoting a hold value. Therefore, because the simulation operation in one or more simulation stages(in this embodiment, the first to third simulation stages) corresponding to the affirmative judgments performed before the first negative judgment is performed for the extraction of the timing verification checking value denoting the set up value and the extraction of the timing verification checking value denoting the hold value in common, the extraction of the timing verification checking value denoting the set up value and the extraction of the timing verification checking value denoting the hold value can be rapidly performed as compared with that performed in the first embodiment.

Embodiment 5

In cases where the pulse time difference 18 between the data pulse 15 and the clock pulse 16 input after the data pulse 15 is shortened, a delay time required to heighten the level of the output pulse 17 to the reference voltage 23 after the heightening of the level of the clock pulse to the reference voltage 23 is lengthened. Therefore, even though the affirmative judgment is performed for the output pulse 17, in cases where a delay time of the output pulse 17 is long, there is a possibility that the D type flip-flop circuit 11 is erroneously operated when the data pulse 15 and the clock pulse 16 are input to the D type flip-flop circuit 11. In this embodiment, in cases where a delay time of the output pulse 17 is long, the negative judgment is performed for the output pulse 17 even though the judgment performed for the output pulse 17 according to the first embodiment is affirmative.

Figure 15:
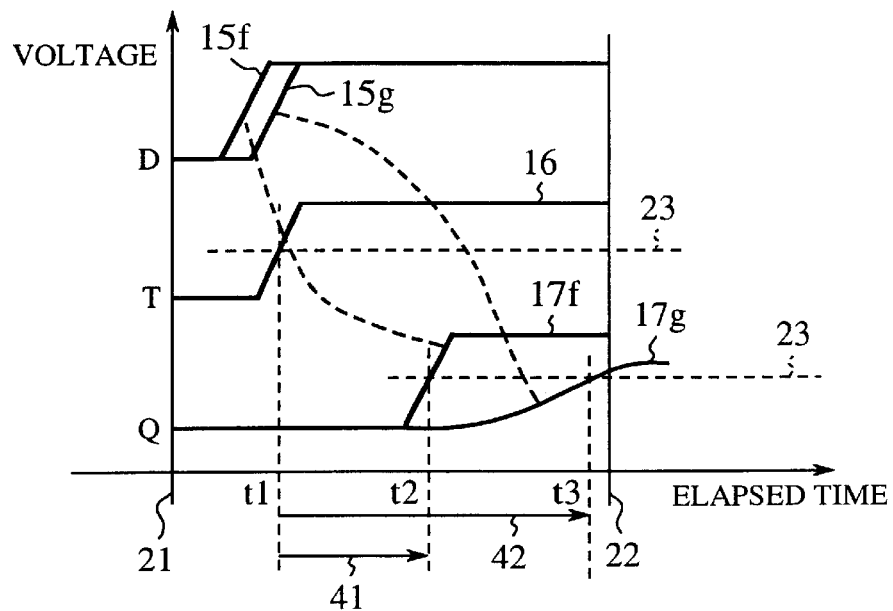
FIG. 15 is an explanatory view of a pulse-time relationship, in which a delay time of an output pulse changing with a pulse time difference is indicated, according to a fifth embodiment of the present invention.

FIG. 15 is an explanatory view of a pulse-time relationship, in which a delay time of an output pulse changing with the pulse time difference is indicated, according to a fifth embodiment of the present invention. In FIG. 15, a reference numeral 15$f$ indicates a data pulse of which a pulse time difference from the clock pulse 16 is sufficiently large, a reference numeral 15$g$ indicates a data pulse of which a pulse time difference from the clock pulse 16 is small, a reference numeral 17$f$ indicates an output pulse output from the D type flip-flop circuit 11 in response to the data pulse 15$f$, and a reference numeral 17$g$ indicates an output pulse output from the D type flip-flop circuit 11 in response to the data pulse 15$g$. Also, a reference sign t1 indicates a time at which the clock pulse 16 crosses the reference voltage 23, a reference sign t2 indicates a time at which the output pulse 17$f$ crosses the reference voltage 23, a reference sign t3 indicates a time at which the output pulse 17$g$ crosses the reference voltage 23, a reference numeral 41 indicates a delay time (t2–t1) of the output pulse 17$f$, and a reference numeral 42 indicates a delay time (t3–t1) of the output pulse 17$g$. The positive judgment is performed for the output pulse 17$f$ because the level of the output pulse 17$f$ is higher than the reference voltage 23 at the simulation completion time 22 and because the delay time 41 of the output pulse 17$f$ is short.

A timing verification checking value extracting method is described with reference to FIG. 2 and FIG. 15.

In cases where the judgment is performed for the output pulse 17$g$ in the simulation process (step ST4) according to the first embodiment, because the level of the output pulse 17$g$ is higher than the reference voltage 23 at the simulation completion time 22, the affirmative judgment is performed for the output pulse 17$g$ in the first embodiment. However, in the fifth embodiment, even though the level of the output pulse 17$g$ is higher than the reference voltage 23 at the simulation completion time 22, the judgment of the circuit simulator 4 is performed according to a delay time 41 of the output pulse 17$f$ and a delay time 42 of the output pulse 17$g$ to prevent an erroneous operation of the D type flip-flop circuit 11.

In detail, in the simulation process (step ST4), a delay time 41 of the output pulse 17$f$ is measured. The delay time 41 starts from the time t1 at which the clock pulse 16 crosses the reference voltage 23 and ends at the time t2 at which the output pulse 17f crosses the reference voltage 23. Also, a delay time 42 of the output pulse 17g is measured. The delay time 42 starts from the time t1 at which the clock pulse 16 crosses the reference voltage 23 and ends at the time t3 at which the output pulse 17g crosses the reference voltage 23. Thereafter, a delay time increasing ratio of the delay time 42 to the delay time 41 is calculated. In cases where the delay time increasing ratio (t3−t1)/(t2−t1) is higher than a prescribed limit, the negative judgment is performed for the output pulse 17g. The prescribed limit is, for example, set to 1.1.

Accordingly, in the fifth embodiment, the delay time increasing ratio of the delay time 42 of a to-be-judged output pulse 17g to the delay time 41 of a referential output pulse 17f corresponding to a sufficiently low pulse time difference is considered, and the negative judgment is performed for the to-be-judged output pulse 17g in the simulation process (step ST4) in cases where the delay time increasing ratio is higher than a prescribed limit. Therefore, the timing verification checking value can be extracted with high precision and with high reliability.

Embodiment 6

In cases where the pulse time difference 18 between the data pulse 15 and the clock pulse 16 input after the data pulse 15 is shortened, an inclination of the data pulse 15 becomes large. Therefore, even though the affirmative judgment is performed for the output pulse 17 according to the first embodiment, in cases where an inclination of the data pulse 15 is large, there is a possibility that the D type flip-flop circuit 11 is erroneously operated when the data pulse 15 and the clock pulse 16 are input to the D type flip-flop circuit 11 at the pulse time difference 18. In this embodiment, in cases where an inclination of the data pulse 15 is large, the negative judgment is performed for the output pulse 17 even though the judgment performed for the output pulse 17 according to the first embodiment is affirmative.

Figure 16:
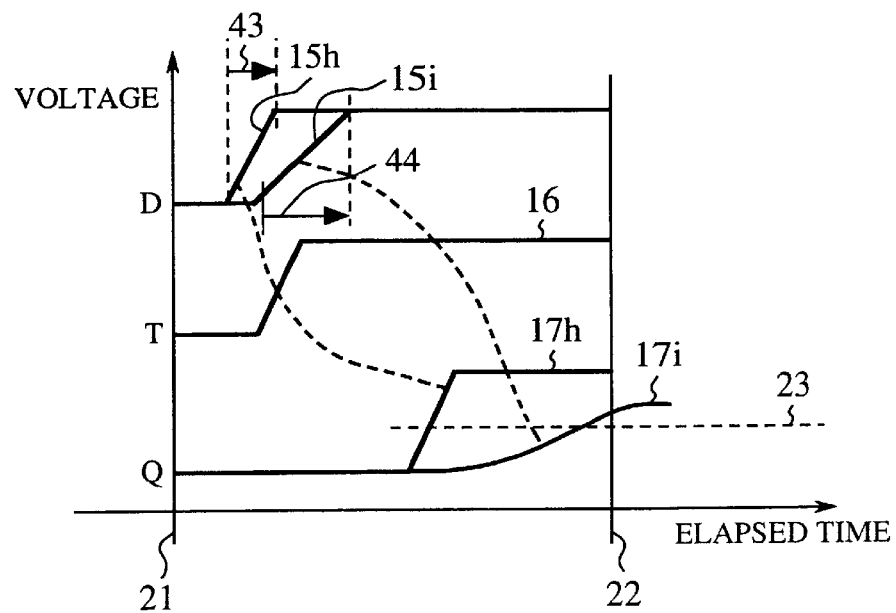
FIG. 16 is an explanatory view of a pulse-time relationship, in which an inclination of a data pulse changing with a pulse time difference is indicated, according to a sixth embodiment of the present invention.
Figure 17:
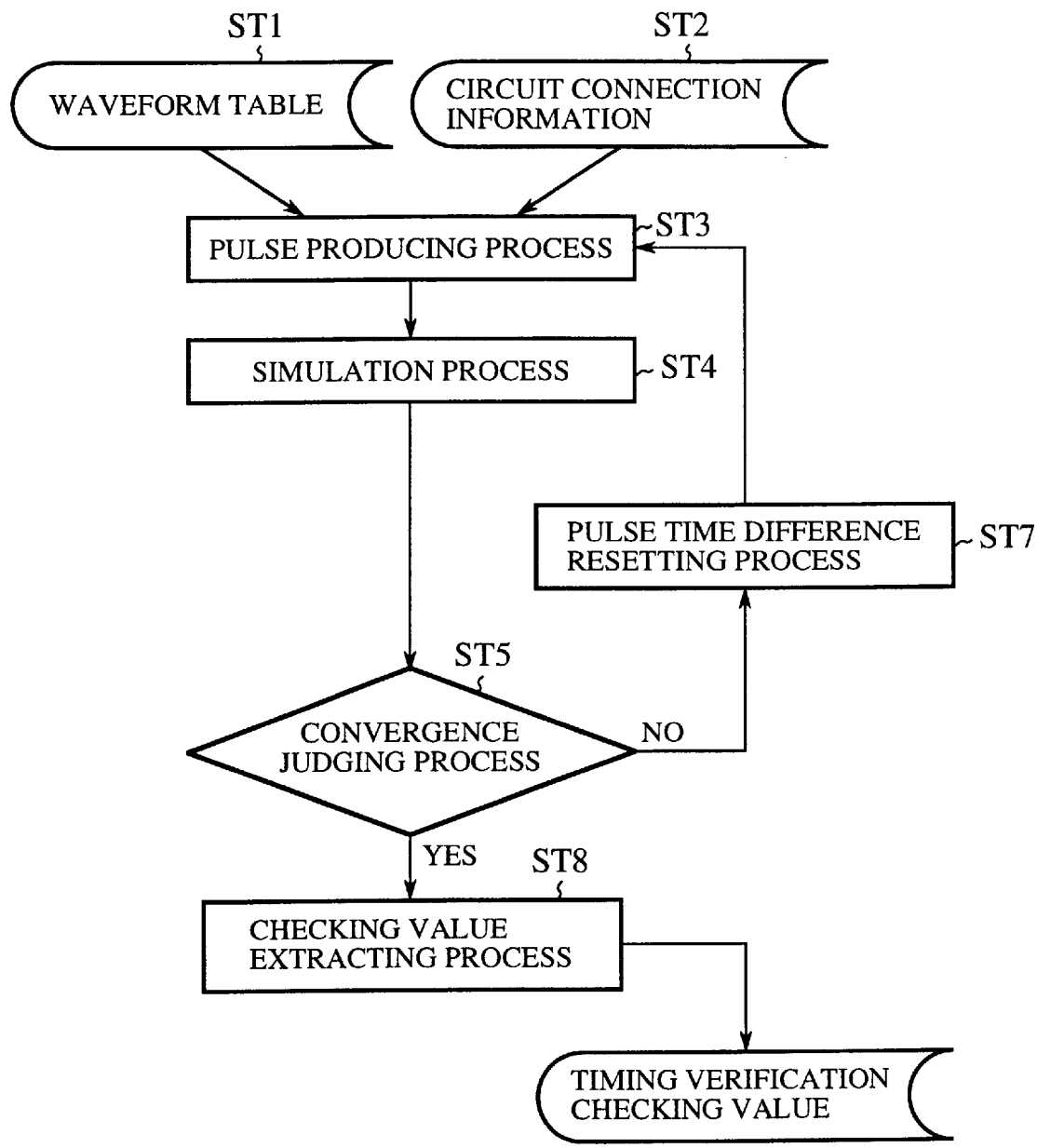
FIG. 17 is a flow chart showing a conventional timing verification checking value extracting method.

FIG. 16 is an explanatory view of a pulse-time relationship, in which an inclination of a data pulse changing with the pulse time difference is indicated, according to a sixth embodiment of the present invention. In FIG. 16, a reference numeral 15h indicates a data pulse which corresponds to a sufficiently large pulse time difference from the clock pulse 16 and has a prescribed low-valued inclination, a reference numeral 15i indicates a data pulse which corresponds to a small pulse time difference from the clock pulse 16 and has a high-valued inclination, a reference numeral 17h indicates an output pulse output from the D type flip-flop circuit 11 in response to the data pulse 15h, and a reference numeral 17i indicates an output pulse output from the D type flip-flop circuit 11 in response to the data pulse 15i. A reference numeral 43 indicates a low-valued referential inclination of the data pulse 15h, and a reference numeral 44 indicates a high-valued inclination of the data pulse 15i. The positive judgment is performed for the output pulse 17h because the level of the output pulse 17h is higher than the reference voltage 23 at the simulation completion time 22 and because the data pulse 15h has the low-valued inclination 43.

A timing verification checking value extracting method is described with reference to FIG. 2 and FIG. 16.

As shown in FIG. 16, in cases where a pulse time difference 18 is made small, the low-valued inclination 43 of the data pulse 15h corresponding to a sufficiently large pulse time difference is changed to the high-valued inclination 44 of the data pulse 15i corresponding to a small pulse time difference. Because the data pulse 15i has the high-valued inclination 44, in cases where the affirmative judgment is performed for the output pulse 17i corresponding to the data pulse 15i because the level of the output pulse 17i is higher than the reference voltage 23 at the simulation completion time 22, there is a possibility that the D type flip-flop circuit 11 is erroneously operated.

Therefore, in the simulation process (step ST4), an inclination value increasing ratio of the high-valued inclination 44 of the data pulse 15i to the referential inclination 43 of the data pulse 15h is calculated. In cases where the inclination value increasing ratio is higher than a prescribed limit, the negative judgment is performed for the output pulse 17i. The prescribed limit is, for example, set to 1.85.

Accordingly, in the sixth embodiment, the inclination value increasing ratio of an inclination of a to-be-judged output pulse 17i to an inclination of a referential output pulse 17h is considered, and the negative judgment is performed for the to-be-judged output pulse 17i in the simulation process (step ST4) in cases where the inclination value increasing ratio is higher than a prescribed limit. Therefore, the timing verification checking value can be extracted with high precision and with high reliability.

What is claimed is:

1. A timing verification checking value extracting method comprising:

a pulse producing step for producing two input pulses having a pulse time difference of which a setting value is set to an initial setting value in advance;

a simulation step for supplying each of the input pulses produced in the pulse producing step to an input terminal of a to-be-timing-verified circuit and judging, until a simulation completion time set in advance, whether or not an output pulse output from an output terminal of the to-be-timing-verified circuit in response to the input pulses is meets or exceeds a predetermined measurable criterion;

an optimum simulation completion time determining step for determining an optimum simulation completion time, which is to be used in the simulation step as the simulation completion time in simulation stages following a first simulation stage, according to a level change time at which the output pulse is changed to a stable level in the first simulation stage;

a pulse time difference resetting step for resetting the setting value of the pulse time difference between the input pulses, which is to be produced in the pulse producing step in a succeeding simulation stage following a current simulation stage, according to the judgment of the simulation step of the current simulation stage by changing the setting value of the pulse time difference by a changing degree, and reducing the changing degree of the pulse time difference in cases where the judgment of the simulation step in the current stage differs from that in a simulation stage preceding to the current stage;

a convergence judging step for judging whether or not the changing degree of the pulse time difference reset in the pulse time difference resetting step is within a prescribed range and making the pulse producing step, the simulation step, the optimum simulation completion time determining step and the pulse time difference resetting step be repeatedly performed until the changing degree of the pulse time difference becomes within the prescribed range; and a checking value extracting step for extracting the pulse time difference between the input pulses as a timing verification checking value according to the judgment performed in the convergence judging step.

2. A timing verification checking value extracting method according to claim 1, wherein the simulation step comprising the steps of:

detecting a delay time which extends from the supply of the one input pulse to the to-be-timing-verified circuit to the production of the output pulse and changes with the pulse time difference; and judging that the output pulse is not good in cases where the delay time is longer than a prescribed limit.

3. A timing verification checking value extracting method according to claim 1, wherein one of the input pulses produced in the pulse producing step has a pulse width of which a setting value is set to an initial setting value in advance, the setting value of the pulse width of the input pulse is reset in the pulse time difference resetting step according to the judgment of the simulation step of the current simulation stage by changing the setting value of the pulse width by a changing degree, the changing degree of the pulse width is reduced in the pulse time difference resetting step in cases where the judgment of the simulation step in the current stage differs from that in a simulation stage preceding to the current stage, it is judged in the convergence judging step whether or not the changing degree of the pulse width reset in the pulse time difference resetting step is within a prescribed range, and the pulse width is extracted in the checking value extracting step as a timing verification checking value in cases where it is judged in the convergence judging step that the pulse width is within the prescribed range.

4. A timing verification checking value extracting method according to claim 1, wherein the checking value extracting step comprises the steps of:

extracting the pulse time difference finally reset in the pulse time difference resetting step as a timing verification checking value in cases where it is judged in the simulation step of the final simulation stage that the output pulse is good; and extracting the pulse time difference corresponding to a specific simulation stage, in which it is finally judged that the output pulse is good, in cases where it is judged in the simulation step of the final simulation stage that the output pulse is not good.

5. A timing verification checking value extracting method, comprising:

a pulse producing step for producing two input pulses having a pulse time difference, of which a setting value is set to an initial setting value in advance, and respectively having a pulse inclination;

a simulation step for supplying each of the input pulses produced in the pulse producing step to an input terminal of a to-be-timing-verified circuit and judging whether or not an output pulse output from an output terminal of the to-be-timing-verified circuit is meets or exceeds a predetermined measurable criterion;

a pulse time difference resetting step for resetting the setting value of the pulse time difference between the input pulses, which is to be produced in the pulse, producing step in a succeeding simulation stage following a current simulation stage, according to the judgment of the simulation step of the current simulation stage by changing the setting value of the pulse time difference by a changing degree, and reducing the changing degree of the pulse time difference in cases where the judgment of the simulation step in the current stage differs from that in a simulation stage preceding to the current stage;

a convergence judging step for judging whether or not the changing degree of the pulse time difference reset in the pulse time difference resetting step is within a prescribed range and making the pulse producing step, the simulation step and the pulse time difference resetting step be repeatedly performed until the changing degree of the pulse time difference becomes within the prescribed range;

a checking value extracting step for extracting the pulse time difference between the input pulses respectively having the pulse inclination as a timing verification checking value according to the judgment performed in the convergence judging step;

a pulse inclination resetting step for setting the pulse inclinations of the input pulses, which are produced in the pulse producing step, to a set of first pulse inclinations to extract the pulse time difference between the input pulses having the first pulse inclinations as a timing verification checking value in the checking value extracting step, resetting the pulse inclinations of the input pulses, which are produced in the pulse producing step, to a set of second pulse inclinations to extract the pulse time difference between the input pulses having the second pulse inclinations as a timing verification checking value in the checking value extracting step, and resetting the pulse inclinations of the input pulses, which are produced in the pulse producing step, to a set of third pulse inclinations between the set of first pulse inclinations and the set of second pulse inclinations to extract the pulse time difference between the input pulses having the third pulse inclinations as a timing verification checking value in the checking value extracting step; and an initial pulse time difference setting step for setting the pulse time difference for the input pulses, which are produced in the pulse producing step and have the third pulse inclinations reset in the pulse inclination resetting step, to a particular setting value according to the timing verification checking value, which is extracted in the checking value extracting step and corresponds to the input pulses having the first pulse inclinations, and the timing verification checking value, which is extracted in the checking value extracting step and corresponds to the input pulses having the second pulse inclinations, to produce the input pulses having the pulse time difference set to the particular setting value and having the third pulse inclinations in the pulse producing step.

6. A timing verification checking value extracting method according to claim 5, further comprising:

a pulse time difference initial changing degree setting step for setting the changing degree of the pulse time difference to a particular changing degree according to the particular setting value of the pulse time difference set in the initial pulse time difference setting step and either the timing verification checking value, which is extracted in the checking value extracting step and corresponds to the input pulses having the first pulse inclinations, or the timing verification checking value, which is extracted in the checking value extracting step and corresponds to the input pulses having the second pulse inclinations, to reset the setting value of the pulse time difference for the input pulses having the third pulse inclinations according to the particular changing degree of the pulse time difference in the pulse time difference resetting step.

7. A timing verification checking value extracting method according to claim 5, wherein the simulation step comprising the steps of:
   detecting a pulse inclination of one input pulse changing with the pulse time difference; and
   judging that the output pulse is not good in cases where the pulse inclination exceeds a prescribed limit.

8. A timing verification checking value extracting method, comprising:
   a pulse producing step for producing two input pulses having a pulse time difference of which a setting value is set to an initial setting value in advance;
   a simulation step for supplying each of the input pulses produced in the pulse producing step to an input terminal of a to-be-timing-verified circuit and judging whether or not an output pulse output from an output terminal of the to-be-timing-verified circuit is meets or exceeds a predetermined measurable criterion;
   a pulse time difference resetting step for repeatedly performing the resetting of the setting value of the pulse time difference between the input pulses, which is to be produced in the pulse producing step in a succeeding simulation stage following a current simulation stage, according to the judgment of the simulation step of the current simulation stage by changing the setting value of the pulse time difference by a changing degree until the judgment of the simulation step of the current simulation stage differs from that of a simulation stage preceding to the current simulation stage to place the pulse time difference in the neighborhood of a set up truth value, repeatedly performing the resetting of the setting value of the pulse time difference between the input pulses, which is to be produced in the pulse producing step in the succeeding simulation stage, according to the judgment of the simulation step of the current simulation stage by changing the setting value of the pulse time difference by the changing degree until the judgment of the simulation step of the current simulation stage again differs from that of a simulation stage preceding to the current simulation stage to place the pulse time difference in the neighborhood of a hold truth value, repeatedly performing the resetting of the setting value of the pulse time difference placed in the neighborhood of the set up truth value according to the judgment of the simulation step of the current simulation stage while reducing the changing degree of the pulse time difference and repeatedly performing the resetting of the setting value of the pulse time difference placed in the neighborhood of the hold truth value according to the judgment of the simulation step of the current simulation stage while reducing the changing degree of the pulse time difference;
   a convergence judging step for judging whether or not the changing degree of the pulse time difference reset in the pulse time difference resetting step is within a prescribed range, making the pulse producing step, the simulation step and the pulse time difference resetting step be repeatedly performed until the changing degree of the pulse time difference placed in the neighborhood of the set up truth value becomes within the prescribed range and again making the pulse producing step, the simulation step and the pulse time difference resetting step be repeatedly performed until the changing degree of the pulse time difference placed in the neighborhood of the hold truth value becomes within the prescribed range; and
   a checking value extracting step for extracting the pulse time difference between the input pulses as a timing verification checking value, in cases where it is judged in the convergence judging step that the changing degree of the pulse time difference placed in the neighborhood of the set up truth value is within the prescribed range, and extracting the pulse time difference between the input pulses as a timing verification checking value in cases where it is judged in the convergence judging step that the changing degree of the pulse time difference placed in the neighborhood of the hold truth value is within the prescribed range.

* * * * *